(12) United States Patent
Del Castillo et al.

(10) Patent No.: US 6,317,714 B1
(45) Date of Patent: Nov. 13, 2001

(54) CONTROLLER AND ASSOCIATED MECHANICAL CHARACTERS OPERABLE FOR CONTINUOUSLY PERFORMING RECEIVED CONTROL DATA WHILE ENGAGING IN BIDIRECTIONAL COMMUNICATIONS OVER A SINGLE COMMUNICATIONS CHANNEL

(75) Inventors: Leonardo Del Castillo, Redmond; Damon Vincent Danieli, Bellevue; Scott Randell, Redmond; Craig S. Ranta, Redmond; Harjit Singh, Redmond, all of WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 08/794,921

(22) Filed: Feb. 4, 1997

(51) Int. Cl.[7] ....................................................... G10L 5/00
(52) U.S. Cl. .......................................... 704/270; 704/258
(58) Field of Search ................................... 704/275, 270, 704/219, 200, 207, 251, 258, 262, 266, 272

(56) References Cited

U.S. PATENT DOCUMENTS

| | | | |
|---|---|---|---|
| 3,493,674 | 2/1970 | Houghton | 348/463 |
| 3,743,767 | 7/1973 | Bitzer et al. | 348/463 |
| 3,891,792 | 6/1975 | Kimura | 348/622 |
| 3,900,887 | 8/1975 | Soga et al. | 360/18 |
| 3,993,861 | 11/1976 | Baer | 348/473 |
| 4,186,413 | 1/1980 | Mortimer | 348/473 |
| 4,207,704 | 6/1980 | Akiyama | 446/301 |
| 4,540,176 | 9/1985 | Baer | 463/37 |
| 4,599,644 | 7/1986 | Fischer | 348/4 |
| 4,660,033 | 4/1987 | Brandt | 340/825.72 |
| 4,665,431 | 5/1987 | Cooper | 348/480 |
| 4,707,858 | 11/1987 | Fette | 704/251 |
| 4,807,031 | 2/1989 | Broughton et al. | 348/460 |
| 4,840,602 | 6/1989 | Rose | 446/175 |
| 4,846,693 | 7/1989 | Baer | 434/308 |
| 4,847,699 | 7/1989 | Freeman | 386/99 |
| 4,847,700 | 7/1989 | Freeman | 386/99 |
| 4,864,607 | 9/1989 | Mitamura et al. | 379/388 |
| 4,930,019 | 5/1990 | Chu | 386/96 |
| 4,949,327 | 8/1990 | Forsse et al. | 369/58 |
| 5,021,878 | 6/1991 | Lang | 348/61 |
| 5,108,341 | 4/1992 | DeSmet | 446/299 |
| 5,198,893 | 3/1993 | Lang | 348/61 |
| 5,270,480 | 12/1993 | Hikawa | 84/645 |
| 5,655,945 | 8/1997 | Jani | 446/175 |

FOREIGN PATENT DOCUMENTS

WO 91/10490   7/1991   (WO).

*Primary Examiner*—Richemond Dorvil
(74) *Attorney, Agent, or Firm*—Jones & Askew, LLP

(57) ABSTRACT

A communications system that provides bandwidth efficient, bi-directional communications over a single communications channel, allowing a master device to control the operation of remote devices. A computer system continuously provides an audio/video presentation on a speaker and display device. During a first time period, the computer system also provides control and speech data, relevant to the presentation, to a link master controller. The link master controller encodes the control and speech data to reduce bandwidth requirements, and then transmits the encoded data to a remote device. The remote device receives and decodes the encoded data, places the data into a data buffer, and uses the data to control at least one motion servo motor and/or provide data to a speech synthesizer. During a second time period, the remote device continues to operate on the data in the data buffer while formulating a response message based on the status of at least one sensor device, encoding the response message, and transmitting the encoded response message to the link master controller. In response to receiving the encoded response message, the link master controller decodes the encoded response message, and provides the response message to the computer system. The computer system responds to the reception of the response data by altering the audio/video presentation in accordance with the response data.

28 Claims, 11 Drawing Sheets

CONTROLLER AND ASSOCIATED MECHANICAL CHARACTERS OPERABLE FOR CONTINUOUSLY PERFORMING RECEIVED CONTROL DATA WHILE ENGAGING IN BIDIRECTIONAL COMMUNICATIONS OVER A SINGLE COMMUNICATIONS CHANNEL

RELATED APPLICATIONS

This application is related to U.S. application Ser. No. 08/795,710, entitled "PROTOCOL FOR A WIRELESS CONTROL SYSTEM"; Ser. No. 08/795,698, entitled "SYSTEM AND METHOD FOR SUBSTITUTING AN ANIMATED CHARACTER WHEN A REMOTE CONTROL PHYSICAL CHARACTER IS UNAVAILABLE"; and Ser. No. 08/795,711, entitled "METHOD AND SYSTEM FOR DETERMINING LIP POSITION AND MOUTH OPENING OF AN ANIMATED CHARACTER", each filed on Feb. 4, 1997 and commonly assigned to Microsoft Corporation, the assignee of the present application.

TECHNICAL FIELD

The present invention relates to communication systems and, more particularly, relates to providing bandwidth efficient, bi-directional communications over a single communications channel for controlling the operation of controllable devices.

BACKGROUND OF THE INVENTION

A variety of consumer products available today rely upon the use of wireless communication. Examples include cordless phones, garage door openers, remote controls for appliances, and remote controlled toys. A common motivation that drives manufacturers of these and similar products is minimizing the cost associated with providing the required wireless communication capability. Thus, techniques to minimize the cost of radio equipment for transmitting and receiving radio frequency signals while maintaining reliable communication are continuously explored.

Microsoft Corporation of Redmond Wash. is developing a product which has motivated several advancements in the art of low cost radio equipment. Generally stated, this product consists of a device capable of receiving control data and speech data from a control system and responding by sending status and sensor data to the control system. More specifically, Microsoft is developing a remotely controlled toy which operates within an interactive learning and entertainment environment for children. The interactive learning and entertainment environment consists of an audio/video presentation and a toy that moves and talks as though it is participating in the presentation.

The remotely controlled toy operates in conjunction with a program running on a control system or a source of control data such as a computer videotape player or broadcast equipment. The control system transmits speech data to the toy which enables the toy to talk. In addition, the control system transmits control data to the toy which enables the toy to move its arms, legs, etc. Finally, the toy is equipped with sensors which can detect certain activity such as a child squeezing the toys hand. The control system can request the toy to transmit the current status of the sensors. Although the technology and capabilities of a toy such as this are quite complex and sophisticated, there is a need to provide these capabilities at low cost. Therefore, there is a need for remotely controlling the movement and voice synthesis capabilities of a controllable device such as a toy.

In the development of this product, Microsoft is addressing several technical limitations. The first technical limitation is due to the limited amount of bandwidth that the FCC has allocated for low-cost, consumer products. Because several products utilize this bandwidth, there is a large potential for cross-talk and interference between these devices. In an effort to minimize interference from other devices and to minimize interfering with other devices, it is desirable to limit the amount of frequency spectrum used by low-cost consumer products. Thus, there is a need for a radio transceiver that makes efficient utilization of the available bandwidth.

One technique that addresses the need for a low cost, bandwidth efficient radio transceiver is using amplitude modulation (AM) radio equipment and modulating a carrier directly with digital data. This technique is beneficial for at least two reasons. First, AM radio equipment is inexpensive and is easy to manufacture. Second, by directly modulating the carrier with the digital data to be transferred, the costs associated with converting the digital data into an analog signal at the transmitter end and then back into digital data at the receiver end can be avoided.

Digital data is generally characterized as a series of binary voltage pulses that represent logical 1's and 0's. The digital data may represent a variety of information such as ASCII text or digitized voice. The use of digital data has become the defacto standard for storing information in computers and electronic devices. In consumer products similar to those described above, it is often necessary to transfer digital information from one device to another. For instance, in response to pressing the volume button on a remote control for a television, the remote control may transmit digital information to a receiver within the television. The television then interprets the received information and adjusts the volume accordingly.

Directly modulating the carrier with digital data is referred to as encoding the digital data onto a carrier signal. The encoding process includes mapping the data bits into signal elements that can then be transmitted. Several techniques are available for encoding digital data and each of these techniques has advantages and disadvantages. The choice of which encoding technique to use primarily involves a tradeoff between conservation of bandwidth or the minimization of data errors.

Common encoding techniques include: non-return to zero (NRZ), return to zero (RZ), bi-phase, pulse delay modulation, and multilevel binary. NRZ encoding produces a signal that is a direct representation of the digital data (i.e., the NRZ signal is at one level for a logical 1 and then transitions to another level for a logical 0). Advantages of NRZ encoding of data include the simplicity of implementing the technique as well as the efficient use of bandwidth. Disadvantages of NRZ encoding include the difficulty in maintaining synchronization and the presence of a DC component in the transmitted signal. Both of these disadvantages result in increasing the cost and complexity of the receiver. The bi-phase encoding techniques utilize at least one transition for each data bit transmitted. The advantages of bi-phase encoding include the ability to easily maintain bit synchronization and the elimination of a DC component. By eliminating any DC components, isolation between a receiver and transmitter can be realized by the use of transformer coupling of the signals. The main disadvantage of bi-phase encoding is the inefficient utilization of bandwidth.

Pulse delay modulation, which uses varying pulse widths to represent unique patterns of one or more bits, is particularly suitable for low cost transceivers. The advantages of pulse delay modulation encoding techniques include the simplicity of implementing the technique, the efficient use of bandwidth, and the ease of maintaining synchronization. In addition, because the information is conveyed by using pulse widths, the polarity of the signal can be made irrelevant in certain implementations. This helps to reduce any DC component in the signal and to simplify the design of the transmitter and receiver. Thus, an inexpensive AM receiver coupled with a microprocessor can be used to detect and decode pulse width modulated signals by counting the clock cycles between edge transitions.

The most prominently known pulse delay modulation technique is the Miller encoding technique. In the Miller encoding technique, a logical 1 is represented by a single transition at the midpoint of a bit interval. A logical 0 is represented by no transition unless it is followed by another logical 0, in which case a signal transition occurs at the end of the bit interval. In certain instances, the Miller encoding technique will result in using less bandwidth than NRZ or bi-phase encoding techniques. In addition, the Miller encoding technique results in at least one transition per two bit times and never more than one transition per bit. This allows the Miller encoding technique to provide some self synchronization capability. The disadvantage of the Miller encoding technique is evident when encoding the worst-case bit pattern ("110110110 . . ."). In the worst-case scenario, the Miller encoding technique can result in generating a signal with a significant DC component and one which requires a wider bandwidth than NRZ. Thus, there is a need for a pulse delay modulation technique which has an improved bandwidth performance in both the best and worst-case scenarios.

A second technological limitation is due to the cost associated with providing by-directional communication between two devices. Generally, bi-directional communication is provided by utilizing two channels, one channel for each direction. For example, cordless phones communicate with a base station in this manner. The use of two channels in a transceiver either requires the use of multiple synthesizers or a single synthesizer that can be tuned to multiple frequencies. Both of these requirements result in increasing the cost and complexity of a transceiver. One technique that has been used to provide bi-directional communication in a bandwidth efficient transceiver is to multiplex bi-directional communication onto a single channel. This technique helps to keep the cost of the transceiver down while improving the bandwidth utilization. Concerning the improved bandwidth utilization, this technique allows a transmitter and receiver to utilize the same frequency spectrum in half-duplex operation. Because dedicated bandwidth is not required for both transmitting and receiving, half-duplex operation requires half of the bandwidth that full-duplex operation requires.

Multiplexing bi-directional communication onto a single channel has some limitations. For instance, if a device is dependent upon the continuous reception of data in real-time, then it may not be practical to multiplex bi-directional communication onto a single channel. For instance, the process of reversing the direction of the channel, transmitting data over the channel, and returning the direction of channel to its previous state interrupts the reception of data in real-time. Thus, for devices requiring the reception of real-time data, the cost reduction and bandwidth efficiency of a half-duplex transceiver may not be realized. Therefore, there is a need for multiplexing bidirectional communication onto a single channel which in turn allows a device that is dependent upon the reception of data in real-time to operate in a half-duplex mode.

A third technical limitation involves the complexity of providing a high quality speech capability to a remotely located, controllable device. Typically, speech can be transmitted by modulating a carrier with the analog speech signal or by digitizing the speech and sending a digitally encoded carrier signal. To provide reasonable speech quality, both of these techniques require significant bandwidth. For instance, modulating a carrier with the analog speech signal will require on the order of 6–8 KHz of bandwidth. On the other hand, a digitally encoded speech signal will require a data rate of 8 Kbits/second or higher. Not only does this technology require significant bandwidth, but the cost of radio equipment that can meet these requirements is not suitable for a low-cost device. Therefore, there is a need for a method to provide high quality speech capability at a lower data rate and that allows the use of inexpensive radio equipment.

SUMMARY OF THE INVENTION

The present invention includes a system and a method for providing bandwidth efficient, bi-directional communications over a single communications channel for controlling the operation of controllable devices. Generally, the present invention provides bandwidth efficient communication by using a data encoding scheme that compresses the data, thereby improving the effective data transmission rate. The encoding scheme compresses the data by reducing the number of signal transitions required to transmit the data. This in turn reduces the bandwidth utilization. The present invention provides bi-directional communication over a single communications channel by transmitting data to the device at a higher rate than the device can expend the data. This allows excess data to be stored in a data buffer. The device can then simultaneously transmit data over the communications channel while expending queued data from the data buffer. Thus, the device can process data without interruption while the transmission direction of the single communications channel is temporarily reversed. The present invention controls the operation of controllable devices by transmitting control and speech data to the controllable devices. By employing the use of linear predictive coding technology, a minimal amount of data is required to accomplish this task.

More specifically, the present invention provides a method for encoding data elements into symbols. Each data element to be converted has a logical value equal to one of two logical values (i.e. 0 or 1). During the encoding process the data elements may be received from a source or be read from a storage device. At the start, a last-encoded-data-element variable is initialized to a first logical value, typically 0. As each data element is received or read, the logical value of the data element and the last-encoded-data-element variable are compared. If the logical values are not equal, the data element is encoded as a first symbol and the logical value of the last-encoded-data-element is equated to the logical value of the encoded data element. At this point, another data element is either received or read and the comparison process is repeated. Thus, when encoding adjacent data elements having different logical values, each data element is encoded as one symbol yielding a one-to-one compression level.

If the comparison process results in determining that the logical values of the data element and the last-encoded-data-element variable are equal, then a next data element is received or read and compared to the previous data element. If the logical values of the two data elements are equal, the two data elements are encoded as a second symbol. If the logical values of the two data elements are not equal, the data elements are encoded as a third symbol. In either case, the logical value of the last-encoded-data-element variable is then equated to the logical value of the last data element received or read, and if any data elements remain, the process is repeated. Thus, when encoding a data element that has the same logical value as the last-data-element-encoded variable, two data elements are encoded as a single symbol. This results in compressing the data elements at a two-to-one compression level.

Upon receiving or reading the last data element, the logical value of the last data element is compare to the logical value of the last-encoded-data-element. If these logical values are equal, then the last data element is encoded as a fourth symbol and the encoding process is terminated. In an alternative embodiment, if the logical values are equal, then the encoding process is terminated without encoding the last data element. This early termination further compresses the data by 1/n, where n is the number of data bits encoded.

The present invention also includes a system and a method for decoding a stream of symbols and recovering one or more data elements from each symbol. Prior to decoding the first symbol, a last-decoded-data-element variable is equated to a first logical value. Upon receiving a symbol, the decoding process is performed. This process includes comparing the symbol to one of four possible symbols and identifying a data element or data elements that are associated with the symbol in view of the current value of the last-decoded-data-element variable. If the symbol is equal to a first symbol, the logical value of the last-decoded-data-element variable is toggled and the logical value of a single data element represented by the first symbol is equated to the logical value of the last-decoded-data-element. If the symbol is equal to a second symbol, the logical value of a first data element represented by the second symbol is equated to the logical value of the last-decoded-data-element variable, the logical value of the last-decoded-data-element is toggled, and the logical value of a second data element represented by the second symbol is equated to the logical value of the last-decoded-data-element. Finally, if the symbol is equal to a third symbol, the logical values of a first and second data element represented by the third symbol are equated to the logical value of the last-decoded-data-element variable. When a stream of symbols are received, this process can be repeated in order to recover a block of data elements. Additionally, if the size of a block of data elements to be received is a known quantity (i.e., N data elements), and a fourth symbol is received after N−1 data elements have been recovered, the Nth data element is equated to the logical value of the last-decoded-data-element variable.

The bandwidth efficiency is further improved by modulating a carrier signal with the symbols using a differential data modulation technique. On a communications channel having a physical data transfer rate of X bits/second, which translates into a standard pulse width of 1/X seconds/bit, this encoding and modulation technique allows the average effective data rate to be increased beyond the X bits/second transfer rate. This is accomplished by: (1) defining the first data symbol to be a pulse with a width of one standard pulse-width; (2) defining the second data symbol to be a pulse with a width of one and a half standard pulse-widths; and (3) defining the third data symbol to be a pulse with a width of two standard pulse-widths. This technique generates a signal that can be transmitted in half the bandwidth of the physical data transfer rate and that has an effective bit rate of up to 133% of the physical data transfer rate (i.e., when the data has the pattern "01100110 . . ."). Thus, the present invention includes a system and a method to efficiently utilize the available bandwidth of a communications channel. Furthermore, the present invention includes a pulse delay modulation technique, differential data modulation, that has an improved bandwidth performance in both best and worse case scenarios.

The present invention also includes a system and a method for providing bidirectional communication on a single communications channel between two devices. In order to accomplish this, one of the devices must include a data buffer for storing data. During a time period $T_F$, a first device transmits data to a second device over the single communications channel at a transfer rate $R_F$. The second device receives the data at the transfer rate $R_F$, stores the data into a data buffer, and expends data from the data buffer at a consumption rate $R_C$. The consumption rate $R_C$ is less than the transfer rate $R_F$. During a time period $T_R$, the second device transmits data to the first device over the single communications channel at a transfer rate $R_R$, while expending data from the data buffer at the consumption rate $R_C$. The values of $T_F$, $T_R$, $R_F$, $R_C$, and $R_R$, are selected to ensure that the data buffer is not overflowed during the time period $T_F$ and under-flowed during the time period $T_R$. In one embodiment, the transfer rate $R_F$ is at least 1.14 times the consumption rate $R_C$.

This aspect of the present invention is advantageous for two reasons. First, by practicing this system and method, bi-directional communication can be performed over a single channel. This allows a cost reduction in the transceivers used to perform the bidirectional communication. Second, several types of devices require the continuous reception of information in real-time. Examples include televisions, radios, and realmation performers. This aspect of the present invention allows a real-time data dependent device to operate in half-duplex mode without sacrificing the real-time performance.

The present invention also includes a system and a method for a master device to control a remotely located speech synthesizing device. The speech synthesizing device includes a receiver, a linear predictive coding (LPC) speech synthesizer, and a speaker. The speech synthesizing device is controlled by selecting a block of LPC coefficients at the master device and transmitting the block of LPC coefficients to the speech synthesizing device. Upon receiving the LPC coefficients, the speech synthesizing device converts the block of LPC coefficients into an audio signal. The audio signal is then sounded through a speaker. In one embodiment, the block of LPC coefficients represents X seconds of speech, and N seconds of speech is provided to the speech synthesizing device by repeating each of the steps until N/X blocks of LPC coefficients have been completed. By employing this aspect of the present invention, speech data can be downloaded to a speech synthesizing device. Furthermore, the amount of data downloaded to the device is minimized. Therefore, high quality, voice capability can be provided at a low data rate. This is advantageous because it allows for the use of less expensive radio equipment in both the master device and the speech synthesizing device.

These and other aspects, features, and advantages of the present invention will be more clearly understood and appreciated from a review of the following detailed description of the present invention and possible embodiments thereof, and by reference to the appended drawings and claims.

DETAILED DESCRIPTION

Figure 1:
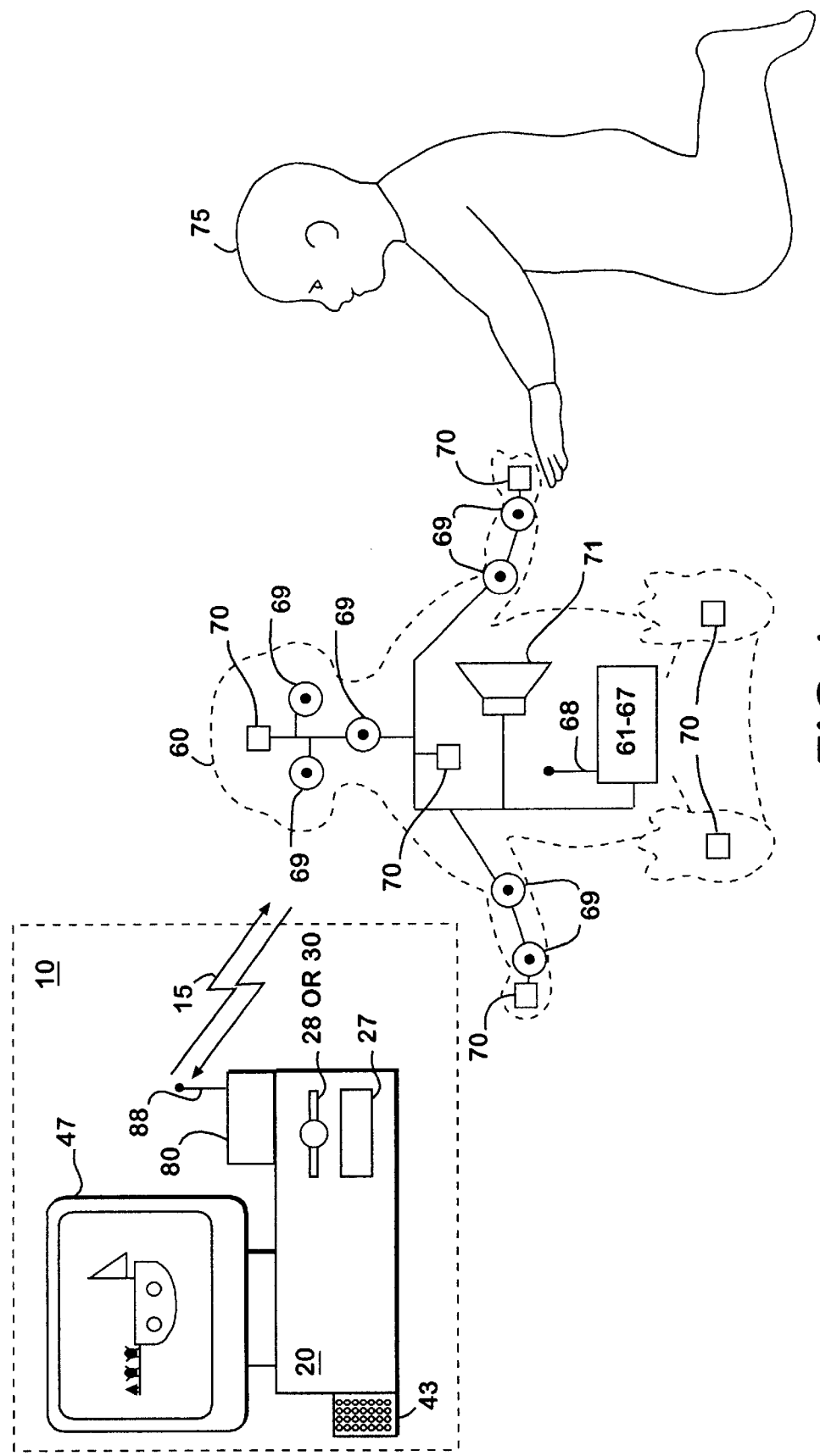
FIG. 1 illustrates an exemplary environment for a duplex embodiment of the present invention.

The present invention is directed toward a system and a method for providing bidirectional communications over a single communications channel for controlling the operation of controllable devices. In one embodiment, the invention is incorporated into an interactive system that controls the operation of one or more animated characters while providing an audio/video presentation on an audio/video display. Briefly described, data is transmitted to the animated characters over a communication link. Upon receiving the data, the animated characters move and talk in a manner dictated by the content of the received data. By transmitting the appropriate data to the animated characters, the animated characters will move and talk as though they are an extension of the audio/video presentation.

Exemplary Operating Environment Aspects of the present invention are described within the context of a system that includes a master device, which communicates with and controls one or more slave devices through a radio frequency (RF) communication channel. More specifically, aspects of the present invention are particularly applicable within a "realmation" system. "Realmation," derived from combining the words "realistic" and "animation," is descriptive of a new technology that Microsoft Corporation of Redmond Wash. is developing. An example of a realmation system includes a master device, such as a computer system with a display, which communicates with and controls one or more slave devices, such as animated mechanical characters. The master device provides scenes of an animated audio/video presentation on the display while simultaneously transmitting control and speech data to one or more animated mechanical characters. The mechanical characters, in response to receiving the control and speech data, move and talk in context with the animated audio/video presentation.

Microsoft Corporation is developing a realmation product that includes two main components: a Realmation Control System acting as the master device, and one or more Realmation Performers acting as slave devices. The Realmation Performers may include a variety of devices that are useful for industrial, educational, research, entertainment or other similar purposes. Each Realmation Performer includes an $R_F$ transceiver system for receiving, demodulating, and decoding signals originating from the Realmation Control System. The signals originating from the Realmation Control System contain control and speech data. The RF transceiver within each Realmation Performer may also encode, modulate and transmit response signals to the Realmation Control System. These transmitted response signals provide the Realmation Control System with status information concerning the Realmation Performers.

The Realmation Control System governs the operation of one or more Realmation Performers while displaying an animated audio/video presentation. The Realmation Control System includes a realmation data source, a Realmation Link Master, and a display system. The realmation data source may be an active device, such as computer system, that controls the Realmation Link Master as well as provides the input of realmation data. Alternatively, the realmation data source may be a passive device, such as a computer, VCR or TV tuner, that feeds realmation data to the Realmation Link Master. Another alternative includes combining the realmation data source with the Realmation Link Master to form a "smart" Realmation Link Master. Regardless of the configuration, the realmation data source provides the input of realmation data, and the Realmation Link Master transmits the realmation data to one or more Realmation Performers.

The main function of the Realmation Link Master is to receive realmation data from the realmation data source, encode the realmation data, and transmit the encoded realmation data to one or more Realmation Performers. In addition, the Realmation Link Master may receive response signals from the Realmation Performers and decode the response signals to recover realmation data.

Two exemplary embodiments of a realmation product include a simplex embodiment and a duplex embodiment. Exemplary embodiments of the Realmation Control System, the Realmation Link Master and the Realmation Performers will be generally described in the context of programs running on microprocessor-based computer systems. Those skilled in the art will recognize that implementations of the present invention may include various types of program modules, use various programming languages, and be operable with various types of computing equipment. Additionally, although the descriptions of exemplary embodiments portray the Realmation Control System as controlling a Realmation Performer over an RF communication channel, those skilled in the art will appreciate that substitutions to the RF communication channel can include other communication mediums such as fiber optic links, copper wires, infrared signals, etc.

Generally, a program, as defined herein, includes routines, sub-routines, program modules, components, data structures, etc., that perform particular tasks or implement particular abstract data types. Moreover, those skilled in the art will appreciate that aspects of the present invention are applicable to other computer system configurations. These other computer system configurations include but are not limited to hand-held devices, multiprocessor systems, microprocessor-based or programmable consumer electronics, minicomputers, mainframe computers, and the like. Aspects of the present invention are also applicable within the context of a distributed computing environment that includes tasks being performed by remote processing devices that are linked through a communications network. In a distributed computing environment, program modules may be located in both local and remote memory storage devices.

In both the presented simplex and duplex embodiments, the Realmation Performers are controllable, animated, mechanical characters intended for providing an interactive learning and entertainment environment for children. At minimum, each Realmation Performer includes a receiver system, a speech synthesizer, a speaker, a processing unit, and one or more servo motors. In response to the receiver system receiving realmation data over the air, the processing unit decodes, interprets, and responds in a manner dictated by the contents of the realmation data. The response of the processing unit may include actuating one or more servo motors and/or providing input to the speech synthesizer.

In the duplex embodiment, the Realmation Performers further include one or more sensor devices and a transmitter system. The sensor devices may detect actions such as a child squeezing the hand, covering the eyes, or changing the position of the Realmation Performer. By monitoring output signals from the sensors, the processing unit may collect status information. Upon receiving a request from the Realmation Control System or by making an autonomous decision, the processing unit can transmit the sensor status information to the Realmation Control System. In response to receiving the sensor status information, the Realmation Control System may alter the animated audio/video presentation in a manner commensurate with the information and/or transmit additional realmation data to the Realmation Performer. For example, in response to the action of a child covering the eyes of the Realmation Performer, the animated audio/video presentation may switch to a game of peek-a-boo.

Thus, in the duplex embodiment, the Realmation Control System engages in bi-directional communication with one or more Realmation Performers. Although the description of this exemplary embodiment of the Realmation Control System portrays a program running on a personal computer and cooperating with another program running on a microprocessor-based communication device, those skilled in the art will recognize that other implementations, such as a single program running on a stand-alone platform, or a distributed computing device equipped with radio communication equipment, may also suffice.

In the simplex embodiment, the Realmation Control System engages in uni-directional communication with one or more Realmation Performers. Although the description of the simplex embodiment of the Realmation Control System portrays a video cassette recorder (VCR) or a cable TV box interfacing with a program running on a microprocessor-based communication device, those skilled in the art will recognize that other implementations, such as direct broadcasting signals, laser disc players, video tape players, computing devices accessing CD-ROM's, etc., may also suffice. Additionally, this embodiment may include integrating a VCR or similar device with a microprocessor-based communication device for operating in a stand-alone configuration.

The communication between the master and slave devices will be described in the context of RF signal transmissions formed in accordance with amplitude modulation ("AM") techniques. The RF signals are used to transfer symbolic representations of digital information from one device to another. The RF signals are generated by modulating the amplitude of a carrier signal in a predetermined manner based on the value of a symbolic representation of the digital data. It should be understood that a variety of communication technologies may be utilized for transmitting the information between these devices and that describing the use of AM techniques should not restrict the principles of any aspect of the present invention.

Referring now to the drawings, in which like numerals represent like elements throughout the several figures, aspects of the present invention and exemplary operating environments will be described. FIG. 1–FIG. 7, in conjunction with the following discussion, are intended to provide a brief, general description of suitable environments in which the invention may be implemented.

Duplex Embodiment: Personal Computer-Based System

FIG. 1 illustrates an exemplary environment for a duplex embodiment of the present invention. This environment presents a child with an interactive learning setting that includes a Realmation Control System 10 which controls and interacts with a Realmation Performer 60. The Realmation Control System 10 includes a conventional personal computer 20; a Realmation Link Master 80; an antenna 88; a speaker 43; and a display device 47. The personal computer 20 may include a hard disk drive 27, a magnetic disk drive 28, and/or an optical disk drive 30.

During operation, the Realmation Control System 10 controls an audio/video presentation on display device 47 and speaker 43. In addition, the Realmation Control System 10 transmits realmation data to the Realmation Performer 60. The realmation data contains control data and speech data for controlling the operation of the Realmation Performer 60. The process of transmitting the realmation data includes encoding the realmation data, modulating a carrier with the encoded realmation data, and emitting the modulated carrier as an $R_F$ signal from antenna 88 over RF communication channel 15.

The Realmation Performer 60 receives the RF signals from the Realmation Control System at antenna 68. The receiver system 61–67 processes the received RF signals to recover the realmation data. The Realmation Performer 60 interprets the received realmation data and responds to the realmation data by controlling the operation of one or more servo motors 69 embodied within the Realmation Performer 60 and/or by providing speech data to be audibly presented on speaker 71. Thus, transmitting the appropriate realmation data to the Realmation Performer 60 causes the Realmation Performer 60 to move and talk as though it is an extension of the audio/video presentation.

The Realmation Performer 60 also includes light sensors and touch sensors 70. In response to a child touching, squeezing or moving the Realmation Performer 60 in an appropriate manner, the light sensors and/or touch sensors 70 within the Realmation Performer 60 may generate status information. In response to a command from the Realmation Control System 10, the Realmation Performer 60 may transmit the status information over the $R_F$ communication channel 15 to the Realmation Link Master 80 for processing by the Realmation Control System 10. By receiving and interpreting the status information, the Realmation Control System 10 can alter the progression of the audio/video presentation in a manner commensurate with the status information.

Figure 2:
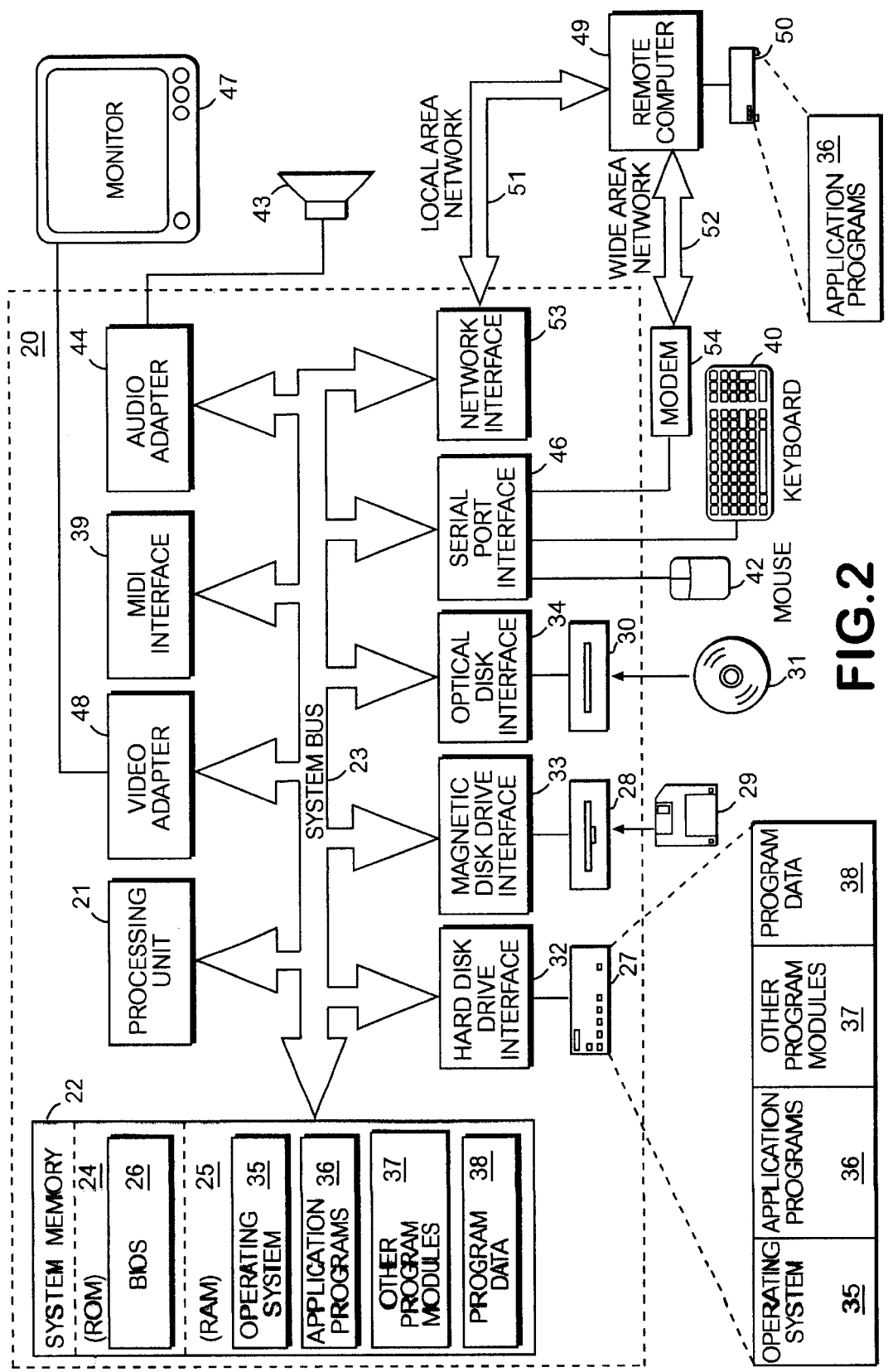
FIG. 2 illustrates an exemplary system for implementing the Realmation Control System 10 of the duplex embodiment illustrated in FIG. 1.

FIG. 2 illustrates an exemplary system for implementing the Realmation Control System 10 of the duplex embodiment. The exemplary system includes a conventional personal computer 20, including a processing unit 21, system memory 22, and a system bus 23 that couples the system memory to the processing unit 21. The system memory 22 includes read only memory (ROM) 24 and random access memory (RAM) 25. The ROM 24 provides storage for a basic input/output system 26 (BIOS), containing the basic routines that help to transfer information between elements within the personal computer 20, such as during start-up. The personal computer 20 further includes a hard disk drive 27, a magnetic disk drive 28 for the purpose of reading from or writing to a removable disk 29, and an optical disk drive 30 for the purpose of reading a CD-ROM disk 31 or to read from or write to other optical media. The hard disk drive 27, magnetic disk drive 28, and optical disk drive 30 interface to the system bus 23 through a hard disk drive interface 32, a magnetic disk drive interface 33, and an optical drive interface 34, respectively. The drives and their associated computer-readable media provide nonvolatile storage for the personal computer 20. Although the description of computer-readable media above refers to a hard disk, a removable magnetic disk and a CD-ROM disk, it should be appreciated by those skilled in the art that other types of media which are readable by a computer, such as magnetic cassettes, flash memory cards, digital video disks, Bernoulli cartridges, and the like, may also be used in the exemplary operating environment.

A number of program modules may be stored in the drives 27–30 and RAM 25, including an operating system 35, one or more application programs 36, other program modules 37, and program data 38. A user may enter commands and information into the personal computer 20 through a keyboard 40 and pointing device, such as a mouse 42. Other input devices (not shown) may include a microphone, joystick, track ball, light pen, game pad, scanner, camera, or the like. These and other input devices are often connected to the processing unit 21 through a serial port interface 46 that is coupled to the system bus, but may be connected by other interfaces, such as a game port or a universal serial bus (USB). A computer monitor 47 or other type of display device is also connected to the system bus 23 via an interface, such as a video adapter 48. One or more speakers 43 are connected to the system bus via an interface, such as an audio adapter 44. In addition to the monitor and speakers, personal computers typically include other peripheral output devices (not shown), such a printers and plotters.

The personal computer 20 may operate in a networked environment using logical connections to one or more remote computers, such as a remote computer 49. The remote computer 49 may be a server, a router, a peer device or other common network node, and typically includes many or all of the elements described relative to the personal computer 20, although only a memory storage device 50 has been illustrated in FIG. 2. The logical connections depicted in FIG. 2 include a local area network (LAN) 51 and a wide area network (WAN) 52. These types of networking environments are commonplace in offices, enterprise-wide computer networks, intranets and the Internet.

When used in a LAN networking environment, the personal computer 20 is connected to the LAN 51 through a network interface 53. When used in a WAN networking environment, the personal computer 20 typically includes a modem 54 or other means for establishing communications over the WAN 52, such as the Internet. The modem 54, which may be internal or external, is connected to the system bus 23 via the serial port interface 46. In a networked environment, program modules depicted relative to the personal computer 20, or portions thereof, may be stored in the remote memory storage device. It will be appreciated that the network connections shown are exemplary and other means of establishing a communications link between the computers such as satellite links and cable modems may be used.

The personal computer 20 contains a musical instrumentation digital interface ("MIDI") adapter 39 that provides a means for the PU 21 to control a variety of MIDI compatible devices (i.e., electronic keyboards, synthesizers, etc.) The MIDI adapter may also allow the PU 21 to control a Realmation Link Master 80. The MIDI adapter operates by receiving data over the system bus 23, formatting the data in accordance with the MIDI protocol, and transmitting the data over a MIDI bus 45. The equipment attached to the MIDI bus will detect the transmission of the MIDI formatted data and determine if the data is to be accepted and processed or ignored. Thus, the Realmation Link Master 80 examines the data on the MIDI bus and processes data that explicitly identifies the Realmation Link Master 80 as the intended recipient. In response to receiving data, the Realmation Link Master 80 may transmit the data over $R_F$ communication channel 15.

Figure 3:
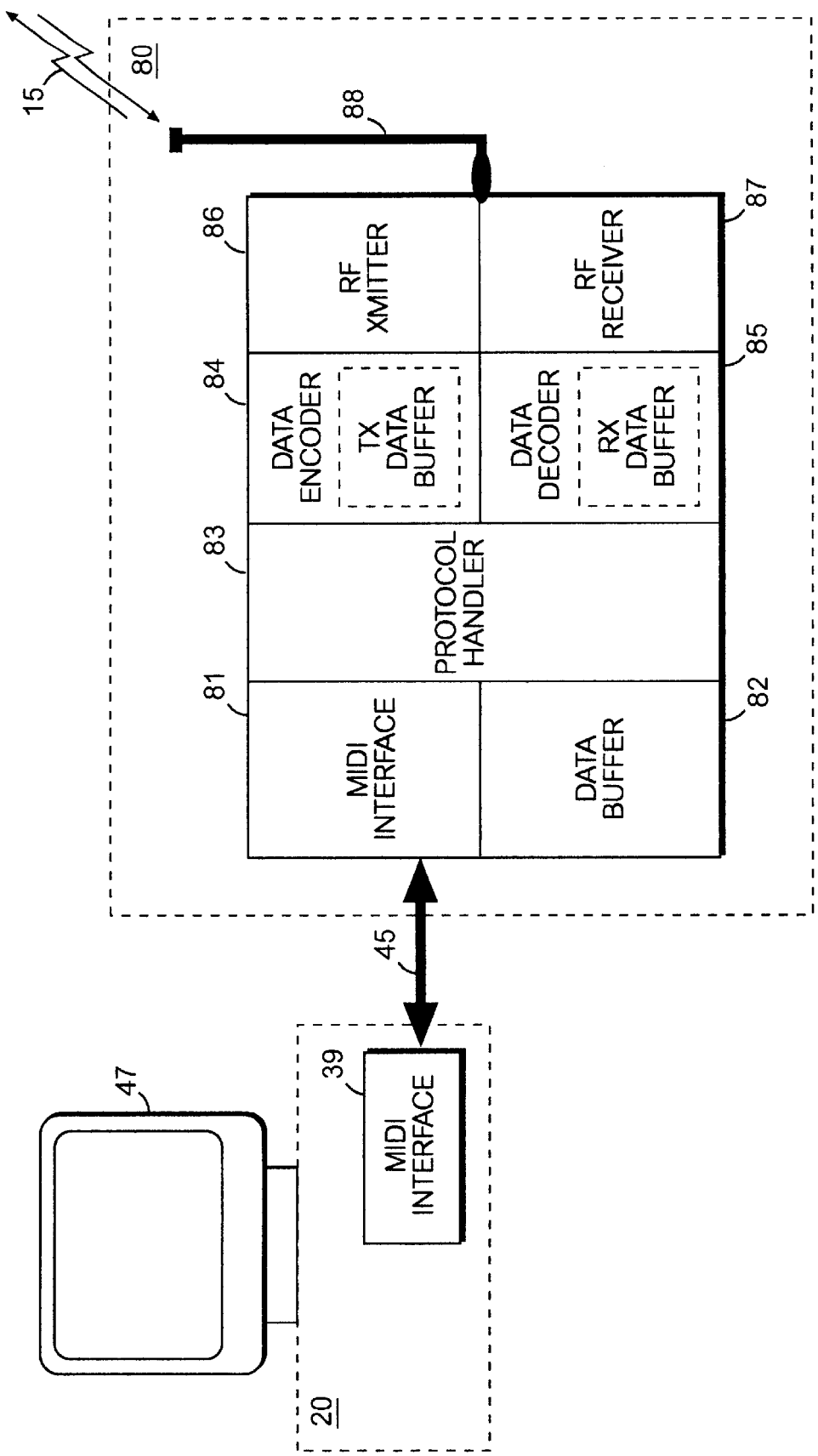
FIG. 3 is a block diagram illustrating the various components and/or processes that define the Realmation Link Master 80 illustrated in FIG. 1.

FIG. 3 is a block diagram illustrating the various components and/or processes that define the Realmation Link Master 80. Initially, a program running on computer 20 obtains realmation data by generating the data or retrieving the data from a storage media accessible to computer 20. In addition, the program may format the realmation data in accordance with a realmation specific protocol, or in the alternative, the program may retrieve pre-formatted realmation data from a storage media. The program transfers the realmation data to the Realmation Link Master 80 over the MIDI interface including MIDI adapters 39 and 81 and MIDI bus 45. This process includes a repackaging of the realmation data into the MIDI format. Those skilled in the art will appreciate that the MIDI interface is only one of several possible interfaces that can be used to transfer realmation data between the computer 20 and the Realmation Link Master 80. Alternative interfaces include, but are not limited to, interfaces such as RS232, Centronix, and SCSI.

The protocol handler 83 receives the MIDI formatted data from the MIDI adapter 81 and removes the MIDI formatting to recover the realmation data. During this process, the protocol handler 83 may temporarily store the realmation data and or the MIDI formatted data in data buffer 82. The protocol handler 83 may also perform other manipulations on the realmation data in preparation for transmitting the data. When completed, the protocol handler 83 passes the data to the TX data buffer within the data encoder 84. Before transmitting the realmation data, the data encoder 84 encodes the realmation data and provides the encoded realmation data to the RF transmitter 86. The RF transmitter uses the encoded realmation data to modulate a carrier and then transmits the modulated carrier over RF communications channel 15 from antenna 88.

The Realmation Link Master 80 may also receive signals carrying realmation data and originating from one or more Realmation Performers 60 or other devices. The Realmation Link Master 80 detects these signals at antenna 88 and provides the signals to the RF receiver 87. The RF receiver 87 demodulates the received signals, recovers encoded realmation data and provides the encoded realmation data to the RX data buffer for the data decoder process 85. The data decoder process 85 decodes the encoded realmation data and provides decoded realmation data to the protocol handler 83. The protocol handler 83 packages the decoded realmation data into the MIDI format and transfers the MIDI formatted data to computer 20 through MIDI interface 81. The protocol handler 83 and or the MIDI interface 81 may temporarily store the realmation data in data buffer 82 during processing.

Upon receiving the information at the MIDI Interface 39, the computer 20 recovers the realmation data from the MIDI formatted data and then processes the realmation data.

Simplex Embodiment: Video Signal-Based System

Figure 4:
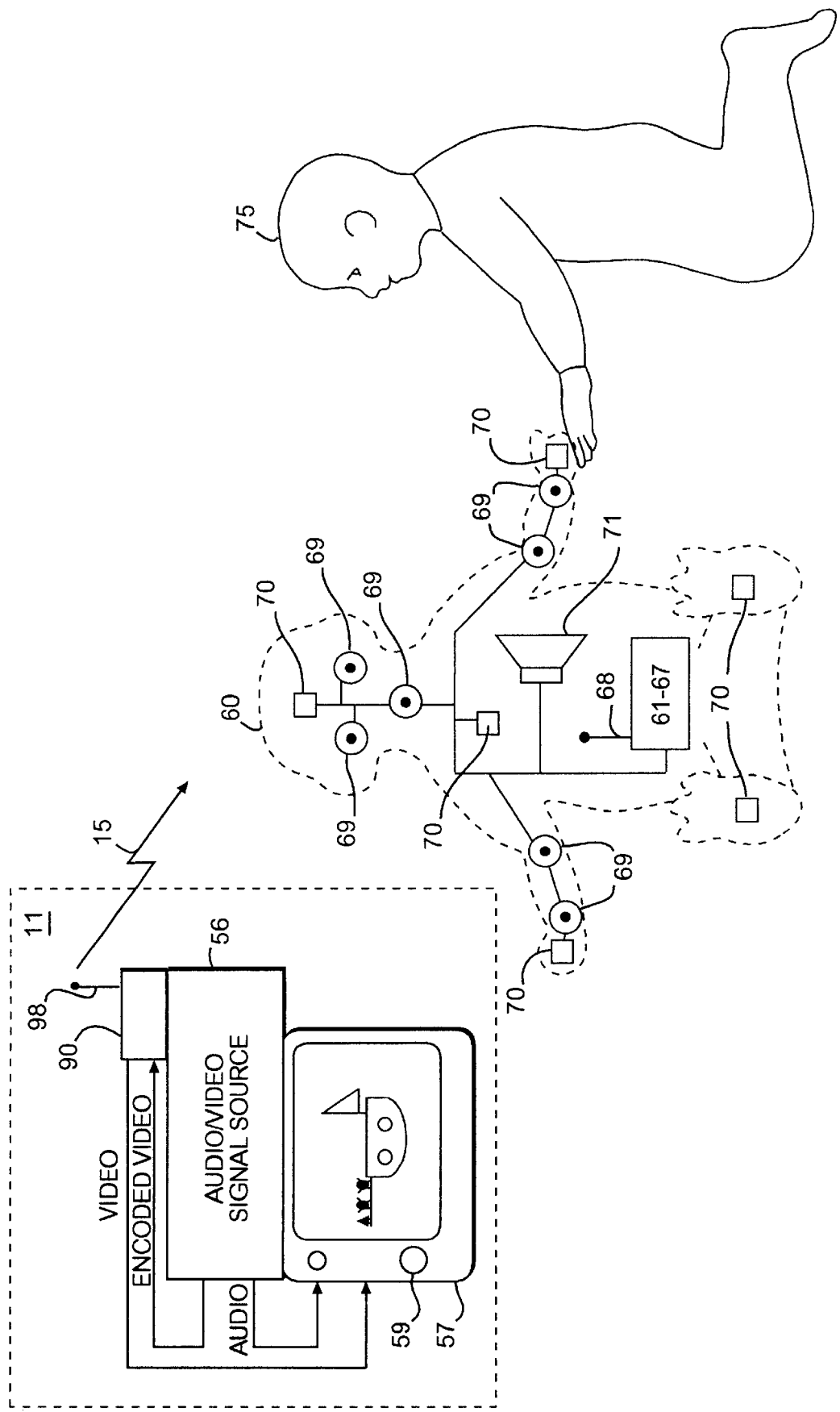
FIG. 4 illustrates an exemplary environment for a simplex embodiment of the present invention.

FIG. 4 illustrates an exemplary environment for a simplex embodiment of the present invention. This environment provides a child with a learning setting that includes a Realmation Control System 11 that controls a Realmation Performer 60. The Realmation Control System 11 includes an audio/video signal source 56, a Realmation Link Master 90, an antenna 98, and a display device 57 including a speaker 59. The Realmation Control System 11 transmits realmation data to the Realmation Performer 60 by means of antenna 98 and an RF communication channel 15. To accomplish this task, the Realmation Link Master 90 interfaces with the audio/video signal source 56 and display device 57 through a standard video interface. Over this standard video interface, the Realmation Link Master 90 receives a video signal encoded with realmation data ("Encoded Video") from the audio/video signal source 56. The Realmation Link Master 90 strips the realmation data from the video signal, and then transfers the realmation data to a Realmation Performer 60 through a $R_F$ communication channel 15. In addition, the Realmation Link Master 90 passes the stripped video signal ("Video") to the display device 57. The audio/video signal source 56 also interfaces with the speaker 59 in the display device 57. Over this interface, the audio/video signal source 56 provides an audio signal ("Audio") for an audio/video presentation. Thus, a child can observe the audio/video presentation on display device 56 and speaker 59 while the Realmation Link Master 90 transmits realmation data to one or more Realmation Performers 60. The reception of the realmation data causes the Realmation Performer 60 to move and talk as though it is an extension of the audio/video presentation.

Figure 5:
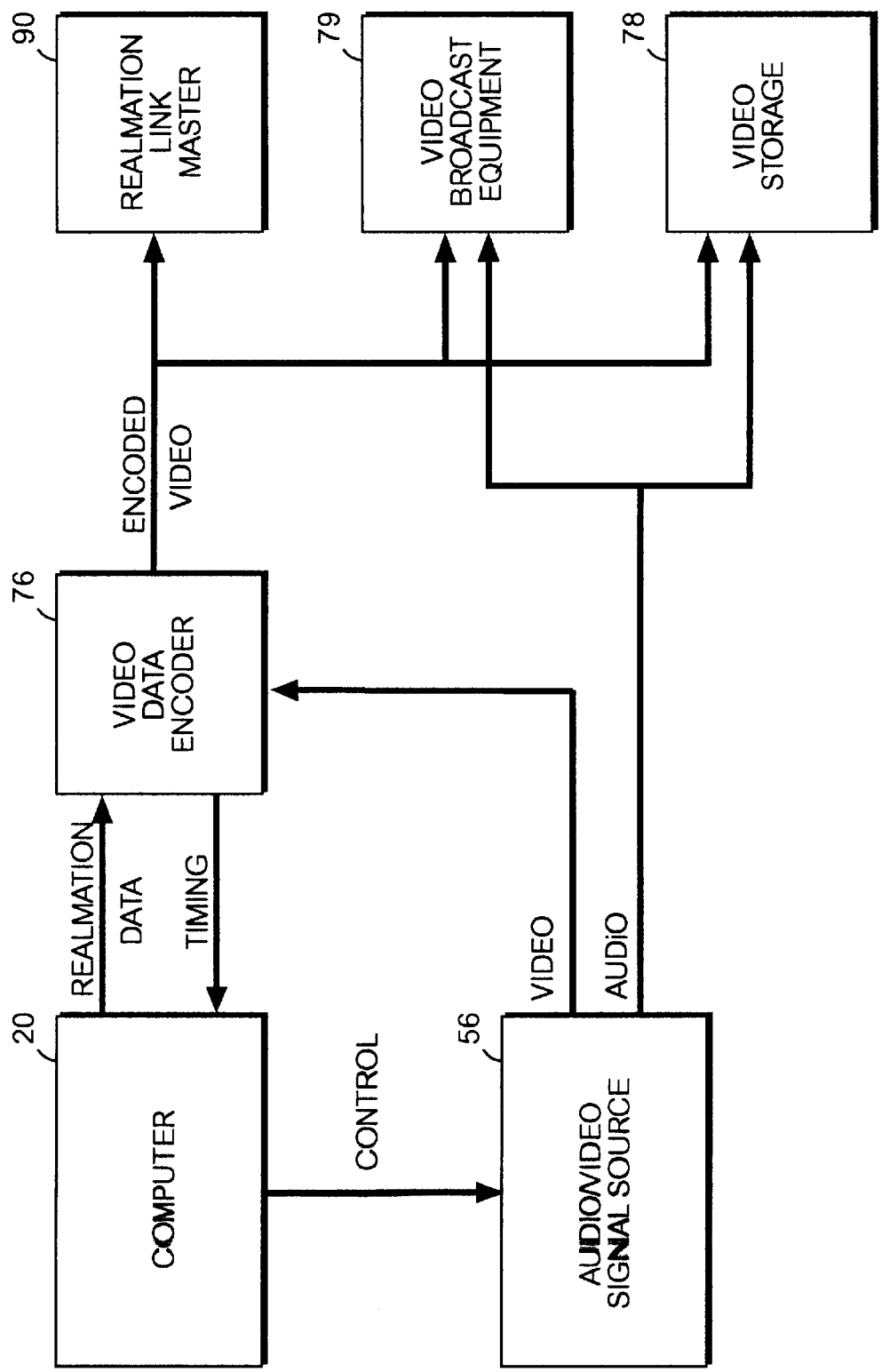
FIG. 5 is a block diagram illustrating a paradigmatic system that generates a video signal encoded with realmation data.

A variety of sources, including but not limited to, a video cassette recorder or player, a cable reception box, a TV tuner, a laser disc player, or a computer with a video output, may provide the Encoded Video. FIG. 5 is a block diagram illustrating a paradigmatic system that generates a video signal encoded with realmation data. In FIG. 5, computer system 20 interfaces with a video data encoder 76 and an audio/video signal source 56. The audio/video signal source 56 provides two output signals: Video and Audio. These output signals may include live camera feeds, pre-recorded playbacks, broadcast reception, etc. The computer system 20 controls the operation of the audio/video source 56 by means of a control signal ("Control"). The Control signal gates the output of the Video and Audio signals from the audio/video signal source 56.

The computer system 20 also provides realmation data for encoding onto the Video signal. The computer system 20 transfers the realmation data and gates the Video signal to the video data encoder 76. The video data encoder 76 provides timing information to the computer system 20 by means of a timing signal ("Timing"). The timing information indicates the points in the video signal that the computer can insert realmation data clips. This is usually accomplished with SMPTE time coding in the vertical blanking interval. The video data encoder combines the Video signal and the realmation data by encoding the realmation data onto the video signal and generating a realmation encoded video signal ("Encoded Video"). This encoding technique includes modulating the luminance of the horizontal over-scan area of the Video signal on a line-by-line basis. This technique results in encoding each line with a single realmation data bit. Furthermore, the field boundaries of the Video signal provide a framing structure for the realmation data, with each frame containing a fixed number of data words.

More specifically, each field of the Video signal can contain a pattern identification word consisting of four bits. The value of the four bit pattern identification word in each contiguous field cyclically sequences through a defined set of values. Detecting the pattern identification word in each field and observing the proper sequence for contiguous fields, distinguishes an Encoded Video signal from a normal Video signal. In a normal Video signal, random "noise" appears in place of the pattern identification word. A decoder attempting to recover realmation data from an Encoded Video signal must detect the presence of the pattern. Thus, the pattern identification word provides an additional layer of integrity to the recovered realmation data beyond that of simple checksum error detection.

A Realmation Link Master 90 receiving the Encoded Video signal from the audio/video signal source 56, may recover the realmation data from the Encoded Video signal, and then transmit the realmation data to a Realmation Performer 60 (shown in FIG. 4). Alternatively, video broadcast equipment 79 may receive the Encoded Video signal along with the Audio signal and then broadcast the signals to one or more remotely located Realmation Link Masters. In another alternative, video storage equipment 78 may receive the Encoded Video signal along with the Audio signal and then store the signals onto a storage medium for future retrieval.

Figure 6:
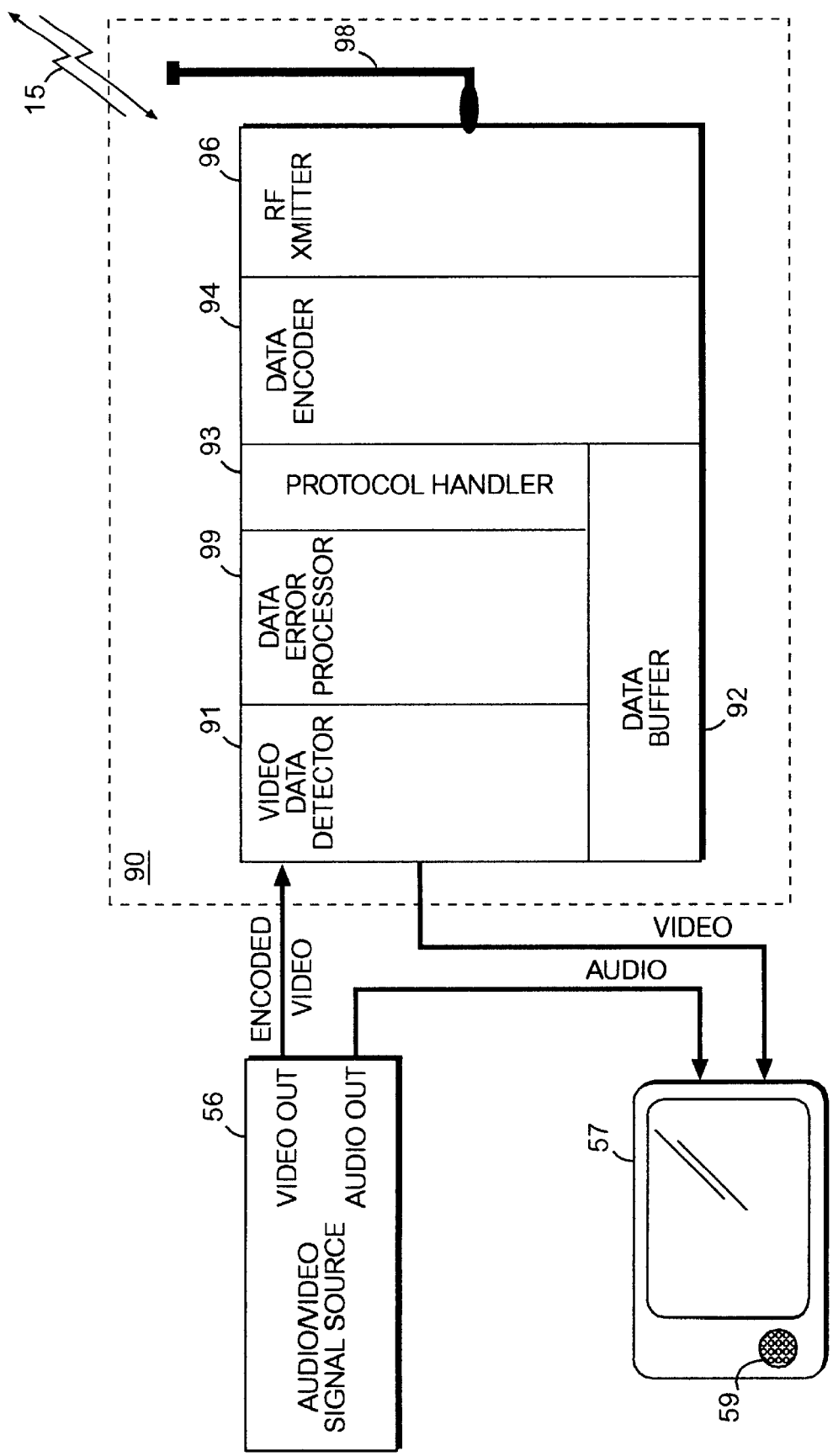
FIG. 6 is a block diagram illustrating the various components and/or processes that define the Realmation Link Master 90 illustrated in FIG. 4.

FIG. 6 is a block diagram illustrating the various components and/or processes that define the Realmation Link Master 90. Each of the components of the Realmation Link Master 90 may be implemented in hardware, software or a combination of both. The video data detector 91 of the Realmation Link Master 90 receives a video signal, originating from an audio/video signal source 56, and identifies if the video signal is an Encoded Video signal. If the video data detector 91 detects the presence of the pattern identification word in the received video signal, then the video signal is an Encoded Video signal. The video data detector 91 then proceeds to remove the realmation data from the Encoded Video signal and then provide the realmation data to the data error processor 99 while providing a non-encoded video signal to the display device 57.

The data error processor 99 analyzes the realmation data to detect and attempt to correct any errors that may exist in the realmation data. After correcting any errors in the realmation data, the protocol handler 93 receives the recovered and verified realmation data and assembles message packets for transmitting to one or more Realmation Performers 60. Upon assembling a message packet, the protocol handler 93 provides the message packet to the data encoder 94. The data encoder 94 encodes the data and provides the encoded data to $R_F$ transmitter 96. The RF transmitter 96, receives the encoded data and modulates a carrier signal with the encoded data. Furthermore, the RF transmitter transmits the modulated carrier through antenna 98. During processing of the realmation data, the various components may temporarily store the realmation data in data buffer 92.

The display device 57 receives the non-encoded video signal Video from the video data detector 91 and an Audio signal from the audio/video signal source 56. The reception of these signals results in an audio/video presentation on the display device 57 and the speaker 59.

The reader should understand that a relationship exists between the audio/video presentation on display device 57 and the realmation data that is transmitted from antenna 98. Although the processes of detecting the realmation data, correcting any errors, encoding the realmation data, and then modulating a carrier may introduce a slight delay, the Video signal received by the display device 57 and the realmation data transmitted from antenna 98 originates from the same area of the original Encoded Video signal. This characteristic allows for the encoding of context sensitive, realmation data onto the video signal. This is significant because transmitting context sensitive realmation data to one or more Realmation Performers, allows the Realmation Performers to move and/or talk in a manner that relates to the audio/video presentation.

Realmation Performer

Figure 7:
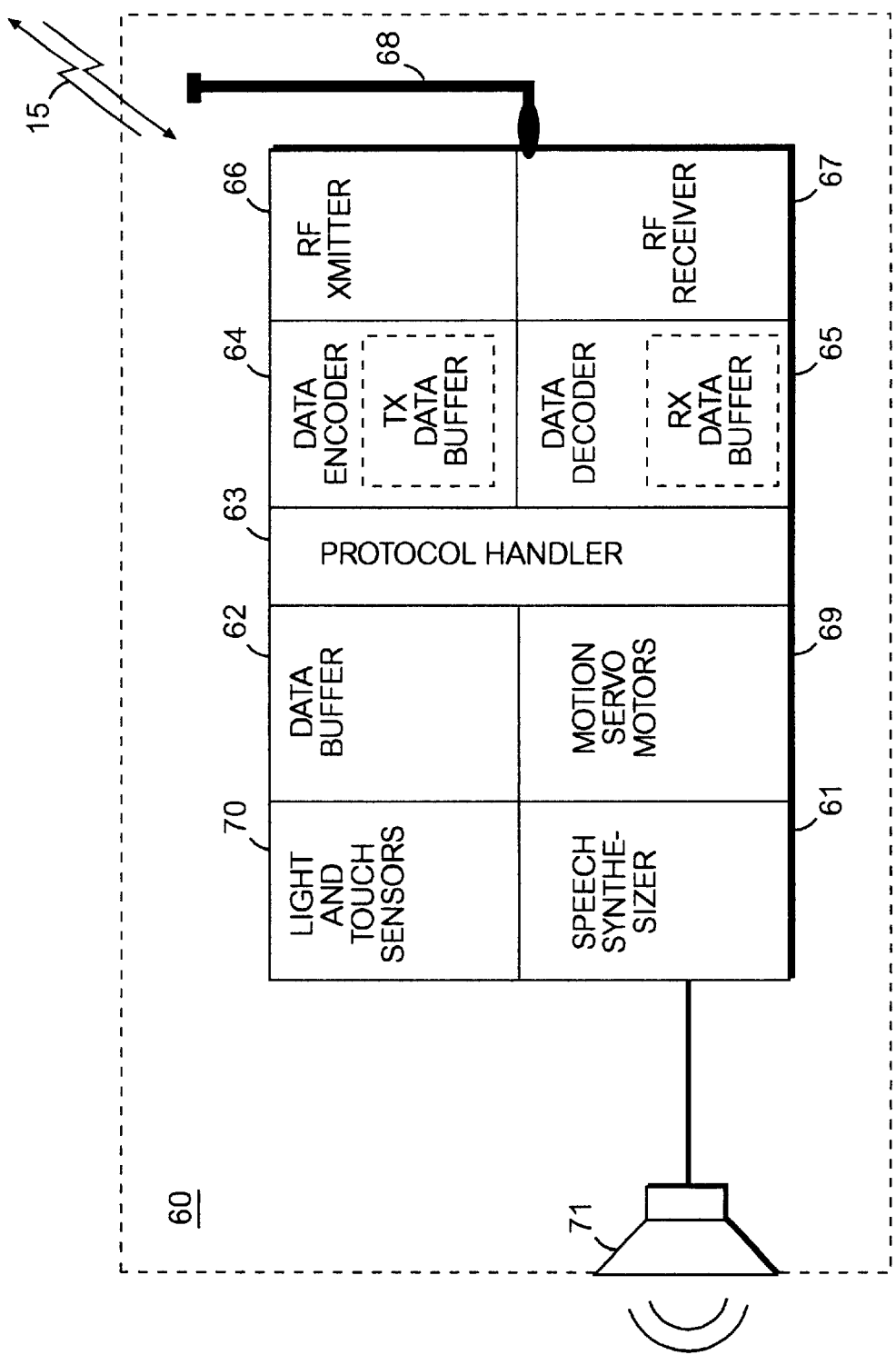
FIG. 7 is a functional block diagram illustrating the various components and/or processes that define a Realmation Performer 60 illustrated in FIGS. 1 and 4.

FIG. 7 is a functional block diagram illustrating the various components and/or processes that define a Realmation Performer 60. Each of these components may be implemented in hardware, software or a combination of both. Generally, the Realmation Performer includes a microprocessor or other processing unit for retrieving a program from ROM, or some other non-volatile storage media, and executing the instructions of the program. In addition, the Realmation Performer 60 includes hardware components such as an $R_F$ radio receiver 67 and possibly a transmitter 66, an antenna 68, a readable and writable data buffer 62, sensors 70, motion servo motors 69, a speech synthesizer 61, and a speaker 71.

The RF receiver 67 receives detected signals from the antenna 68. The $R_F$ receiver operates on the received signal by demodulating the carrier and recovering encoded realmation data. Next, the data decoder 65 receives and decodes the encoded realmation data. The protocol handler 63 receives the decoded realmation data output from the decoder 65 and interprets the realmation data. Based on the content of the realmation data, the program sends control signals and/or speech data to the appropriate devices. Thus, if the realmation data contains control information, one or more of the motion servo motors 69 will receive control signals causing them to be actuated. Furthermore, if the realmation data contains speech data, the speech synthesizer 61 will receive the speech data, convert the speech data into audio signals, and then provide the audio signals to the speaker 71. The realmation data may be temporarily stored in data buffer 62 while various processes are being performed.

The Realmation Performer 60 may also include light sensors and touch sensors 70. The sensors 70 may generate status information in response to variations in pressure, light, temperature or other parameters. The Realmation Performer 60 may transmit this status information to the Realmation Control System 10 (shown in FIG. 1). This process includes formatting the status information in protocol handler 63, encoding in the status information in data encoder process 64, modulating a carrier with the encoded status information in RF transmitter 66, and then transmitting the modulated carrier over RF communications path 15 through antenna 68.

Differential Data Modulation

Figure 8:
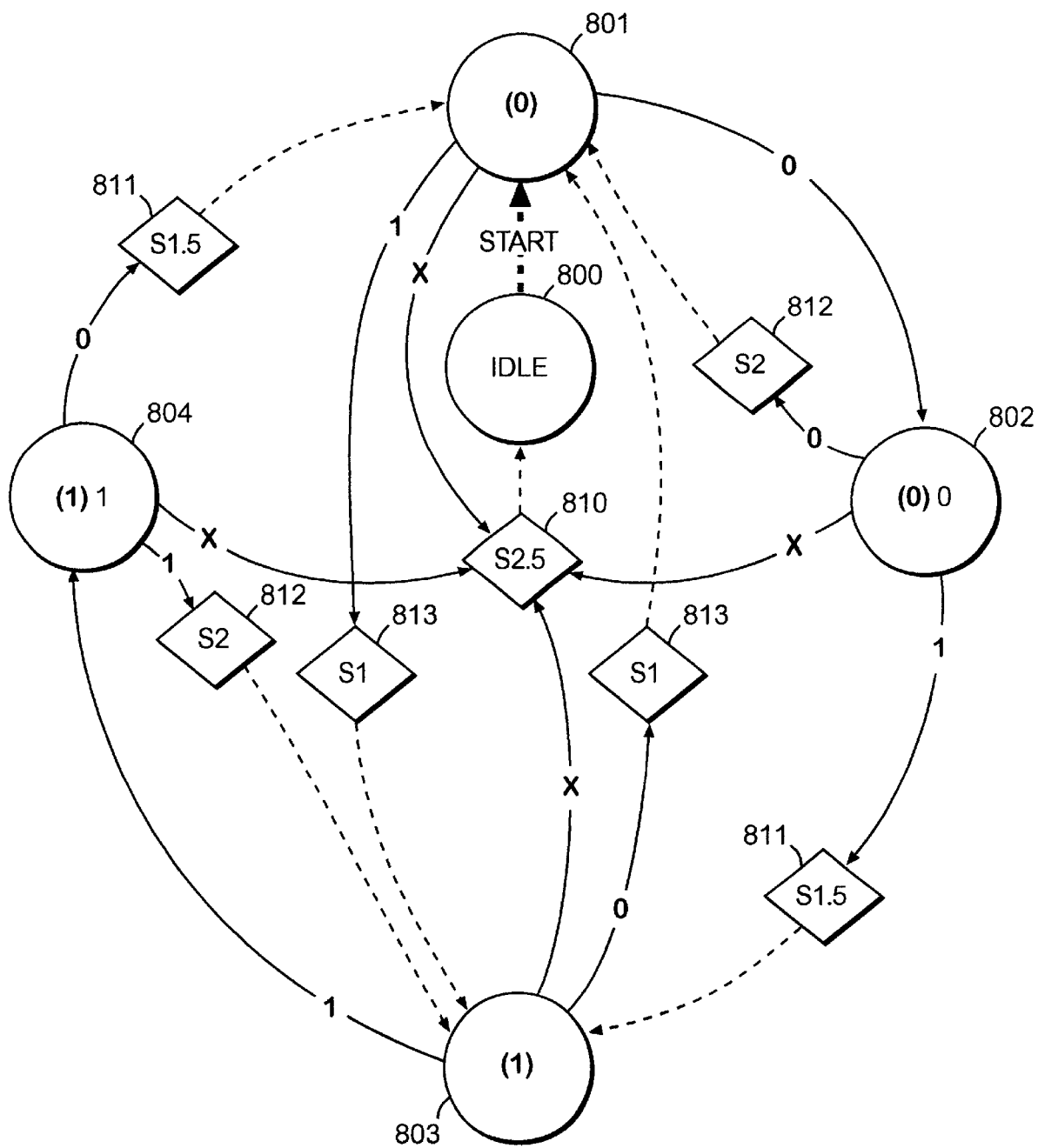
FIG. 8 is a state diagram illustrating the encoding aspect of the present invention.
Figure 9:
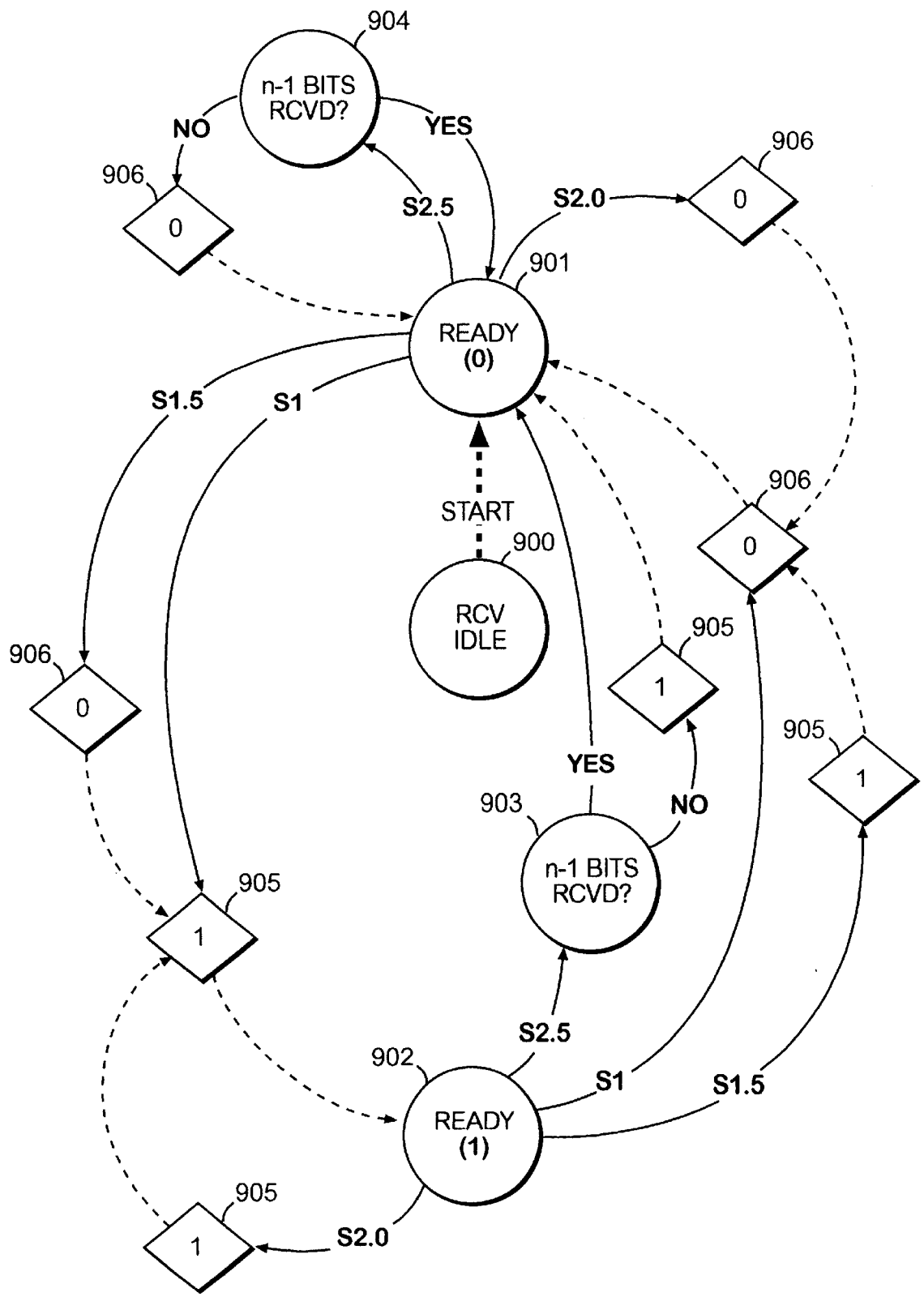
FIG. 9 is a state diagram illustrating the decoding aspect of the present invention.

FIGS. 8–9 are state diagrams illustrating the encoding and decoding aspects of the present invention respectively. These aspects of the present invention provide the basis for an improved pulse delay modulation technique which has efficient bandwidth utilization in both the best and worst-case scenarios. This technique is referred to as differential data modulation ("DDM") and involves encoding a stream or block of data based on the differences in consecutive bits. This technique is different from previous pulse delay modulation techniques that encode the absolute values of the data.

Turning to FIG. 8, the encoding process includes five static states (labeled IDLE, (0), (0)0, (1), and (1)1) and four transitional states (labeled S1, S1.5, S2, S2.5). The static states are shown as solid circles and represent the content of previously encoded, read, or received data bits. Thus, each of the static states are defined as follows:

IDLE—the data encoding process has not started;
(0)—the last data bit encoded was a logical 0, or the encoding process has just started;
(0)0—the last data bit encoded was a logical 0, and the last data bit read or received for encoding was a logical 0;
(1)—the last data bit encoded was a logical 1; and
(1)1—the last data bit encoded was a logical 1, and the last data bit read or received for encoding was a logical 1.

The transitional states are shown as diamond boxes and represent a process of encoding one or more data bits into a symbol. In an exemplary embodiment, the symbols are used to amplitude modulate a carrier signal by either keying a transmitter on or keying a transmitter off for an amount of time representative of the symbol. The amount of time that the transmitter is either on or off is a function of a basic time unit such as the width of a single pulse. Although the symbols are described as pulses of various widths, this encoding process also is applicable in generating other symbol types such as signals of varying amplitude, frequency, etc. If the basic time unit for a single pulse is one standard pulse units, the symbols generated for an exemplary embodiment in each of the transitional states are defined as:

S1—symbol representing a pulse width of one standard pulse units;
S1.5—symbol representing a pulse width of one and a half standard pulse units;
S2—symbol representing a pulse width of two standard pulse units; and
S2.5—symbol representing a pulse width of two and one half standard pulse units.

Transitions from one static state to the next occur in response to one of three events: 0, 1, X. Events 0 and 1 occur when a binary digit, having a logical value of 0 or 1, respectively, is read from the block of data. Event X occurs after reading the last binary digit from the block of data. In FIG. 8, the events are identified as solid lines with the event labels 0, 1, or X embedded within the line. A transition between static states may result in passing through one or more transitional states. In a transitional state, a specific process is performed and the transitional state is automatically exited upon completing the process. The automatic transition from a transitional state is illustrated by a broken line. Thus, each event results in a transition from one static state to another static state with the possibility of passing through a transitional state.

Initially, the IDLE state 800 is active. Upon starting the encoding process ("START"), the IDLE state 800 is exited and the (0) state 801 is entered. In addition, an S2.5 symbol may be generated prior to entering the (0) state 801. In an exemplary embodiment, the S2.5 symbol is used to frame the data. Thus, an S2.5 symbol appears as the first and last symbol of a block or stream of symbols.

In the (0) state 801, a last-bit variable is initialized to the logical value 0. In each of the static states, excluding the IDLE state 800, the current value of the last-bit variable is indicated in parenthesis. Thus, in the (0) state 801, the last-bit variable is set to the logical value of 0. A transition from the (0) state 801 occurs in response to one of three events. The first event includes reading a binary 0 from the block of data to be encoded. When this event occurs, the (0)0 state 802 is entered. The (0)0 state 802 indicates that the value of the last-bit variable is a logical 0 and the value of the next bit to be encoded is a logical 0. The second event that may occur in the (0) state 801 is reading a binary 1 from the block of data to be encoded. When this event occurs, the S1 symbol 813 is generated and the (1) state 803 is entered. The (1) state 803 indicates that the last-bit variable is set to the value of the last binary digit read and encoded. The third event that may occur in the (0) state 801 is determining that no additional data remains to be encoded. When this event occurs, the S2.5 symbol 810 is generated and the IDLE state 800 is entered.

In the (0)0 state 802, the last-bit variable is a logical 0 and the last bit read from the block of data is a logical 0. From the (0)0 state 802, the event of reading a binary 0 from the block of data results in generating the S2 symbol 812 and entering the (0) state 801. Furthermore, the event of reading a binary 1 from the block of data results in generating the S1.5 symbol 811 and entering the (1) state 803. Finally, if no additional data remains in the block of data, this event results in generating the S2.5 symbol 810 and entering the IDLE state 800.

The (1) state 803 is only entered as a result of reading a binary 1 from the block of data. Thus, in the (1) state 803, the last-bit variable is set to the logical value 1. Three events can occur in the (1) state 803. The first event includes reading a binary 0 from the block of data to be encoded. This event results in generating the S1 symbol 813 and entering the (0) state 801. The second event includes reading a binary 1 from the block of data to be encoded. This event results in entering the (1)1 state 804 where the last-bit variable remains as a logical 1. The third event includes detecting that no additional data remains to be encoded in the block of data. This event results in generating the S2.5 symbol and entering the IDLE state 800.

In the (1)1 state 804, the last-bit variable is a logical 1 and the last bit read from the block of data is a logical 1. From the (1)1 state 804, the event of reading a binary 1 from the block of data results in generating the S2 symbol 812 and entering the (1) state 803. Furthermore, the event of reading a binary 0 from the block of data results in generating the S1.5 symbol 811 and entering the (0) state 801. Finally, if no additional data remains in the block of data, this event results in generating the S2.5 symbol 810 and entering the IDLE state 800.

Each symbol generated by the DDM technique represents one or two data bits. Thus, the DDM technique provides a level of data compression. When encoding the data pattern (0,1,0,1,0,1 . . . ), an S1 symbol is generated for each bit yielding a worst-case compression of 1 to 1. Therefore, encoding this data pattern with the DDM technique produces the same number of symbols as NRZ encoding. When encoding the data patter (0,1,1,0,0,1,1 . . . ), an S1.5 symbol is generated for every two. This results in a compression factor of 2=1 for the data=symbol ratio, and 2=1.5 for time ratio. Likewise, when encoding the data pattern (0,0,0,0 . . . ) or (1,1,1,1 . . . ), an S2 symbol is created for every two bits and the compression factor is 2 to 1. Thus, although the actual compression factor is data dependent, the DDM technique will compress the data by a factor ranging from 0 to 33%. Furthermore, if the (0)0 state 802 or the (1)1 state 804 are entered when the last binary digit is read, then it may not be necessary to encode the last binary digit. This is possible in an embodiment that uses the S2.5 symbol to frame a block of data having a known size. For instance, assume that symbols representing a block of data having X bits are being received. If an S2.5 symbol is received between decoding the X−1st and the Xth bits, then it can be concluded that the previous state was either the (0)0 state 802 or the (1)1 state 804. Furthermore, if the X−1st bit is equal to a logical 1, then the previous state was (1)1 state 804 and hence, the Xth bit is equal to a logical 1. If the X−1st bit is equal to a logical 0, then the previous state was (0)0 state 802 and hence, the Xth bit is equal to a logical 0. This characteristic of the DDM technique further improves the compression ratio of symbols to data.

FIG. 9 is a state diagram of the DDM decoding process. The decoding process includes three static states: RCV IDLE; Ready (0); and Ready (1). In addition, the decoding process includes three transitional states: 0; 1; and "n−1 bits rcvd?". Transitions between the static states occur upon the event of receiving one of four possible symbols. FIG. 9 illustrates these four events as solid lines with a symbol identifier including either S2.5, S2, S1.5 or S1. The decoding process includes successively receiving symbols, either from a receiver subsystem or some other source, and identifying the binary digit or digits that the symbol represents.

Each state transition results in identifying one or two binary digits. Upon identifying the binary digits, they may be stored for later retrieval or immediately transferred to a separate process. FIG. 9 illustrates the process of identifying binary digits as transitional states 0 and 1, each of which are enclosed in diamond boxes. When transitioning from one state to the next, one or more of these transitional states will be entered and exited. In addition, in response to the event of receiving an S2.5 symbol, the "n−1 bits rcvd?" transitional state is entered. In this state, the number of binary digits identified since the last S2.5 symbol are summed and then compared to an expected number of binary digits.

Initially, the RCV IDLE state 900 is active. Upon receiving one or more synchronization symbols, the Ready (0) state 901 is entered and a last-bit identified variable is set to the value for a logical 0. The RCV IDLE state 900 is re-entered from the Ready (0) state when no additional symbols have been received for a determined period of time.

In the Ready (0) state 901, the decoding process is ready to receive symbols and identify the binary digits represented by the symbols. Receiving an S1 symbol in the Ready (0) state 901 results in entering transitional state 905, identifying a binary 1, and then entering the Ready (1) state 902. Receiving the S1.5 symbol in the Ready (0) state 901 results in entering transitional states 906 and 905, identifying a binary 0 and 1 respectively, and then entering the Ready (1) state 902. Receiving the S2 symbol in the Ready (0) state 901 results in entering transitional state 906 two times, identifying binary 0 and 0, and then returning to the Ready (0) state 901. Finally, receiving the S2.5 symbol in the Ready (0) state 901 results in entering transitional state 904. If the number of identified binary digits is one less than the expected number, transitional state 906 is entered identifying a binary 0, prior to returning to the Ready (0) state 901. If the number of identified binary digits is not one less then the expected number, then the Ready (0) state 901 is re-entered.

In the Ready (1) state 902, similar to the Ready (0) state 901, four symbols can be received. Receiving the S1 symbol in the Ready (1) state 902 results in entering transitional state 906, identifying a binary 0, and then entering the Ready (0) state 901. Receiving the S1.5 symbol in the Ready (1) state 902 results in entering transitional states 905 and 906, identifying a binary 1 and 0 respectively, and then entering the Ready (0) state 901. Receiving the S2 symbol in the Ready (1) state 902 results in entering transitional state 905 two times, identifying two binary 1's, and then returning to the Ready (1) state 902. Finally, receiving the S2.5 symbol in the Ready (1) state 902 results in entering transitional state 903. If the number of identified binary digits is one less than the expected number, transitional state 906 is then entered identifying a binary 1, prior to entering the Ready (0) state 901. If the number of identified binary digits is not one less then the expected number, then the Ready (0) state 901 is entered.

To transmit the encoded data to a remote device, the symbols generated by the DDM technique are used to modulate a carrier signal. In an exemplary embodiment, the symbols are used to amplitude modulate a carrier signal by either keying a transmitter on or keying a transmitter off for an amount of time representative of the symbol. Thus, if the basic time unit for a single bit is 200 µs, the symbols for an exemplary embodiment are represented turning the carrier signal either on or off for the following time periods:

S1: 200 µs;
S1.5: 300 µs;
S2: 400 µs; and
S2.5: 500 µs.

A receiver, receiving a signal modulated by this technique, measures the time between on/off transitions of the carrier signal and correlates the measured time with the symbols. In an exemplary embodiment, the S2.5 symbol is used as a synchronization signal and defines the boundaries of a message. Each message is preceded and succeeded by at least one synchronization symbol.

Table 1 tabulates the bandwidth requirement and the effective bit rate for various bit stream scenarios when using the DDM technique. Each of these scenarios assumes that the basic time unit for a bit is 200 µS.

TABLE 1

| Bit Pattern | Symbol Pattern | Period | Bandwidth Required | Effective Bit Rate (bits/sec) |
|---|---|---|---|---|
| 0101010 . . . | S1 S1 S1 . . . | 400 µS | 2.5 KHz | 5K |
| 0110011 . . . | S1.5 S1.5 S1.5 . . . | 600 µS | 1.67 KHz | 6.67K |
| 0000000 . . . | S2 S2 S2 . . . | 800 µS | 1.25 KHz | 5K |

The DDM technique is advantageous over traditional encoding schemes for several reasons. Primarily, the DDM technique makes efficient use of bandwidth. In the worst-case scenario, the DDM signal requires 2.5 KHz worth of bandwidth and provides an effective bit rate of 5K bits/sec. Thus, the worst-case DDM signal achieves the same bandwidth efficiency of the worst-case NRZ encoded signal. In addition, unlike NRZ, a DDM signal guarantees that a transition will occur at least every two bits. This operates to reduce any DC component in the transmitted signal. Furthermore, the guaranteed signal transitions allow for easy bit synchronization. Finally, bordering each message with a synchronization symbol (S2.5) allows the receiver to re-synchronize with the transmitter at the beginning of each message. This operates to limit the effect of burst errors to the message being affected by the burst errors.

Bi-directional Communication over a Single Channel

Figure 10A:
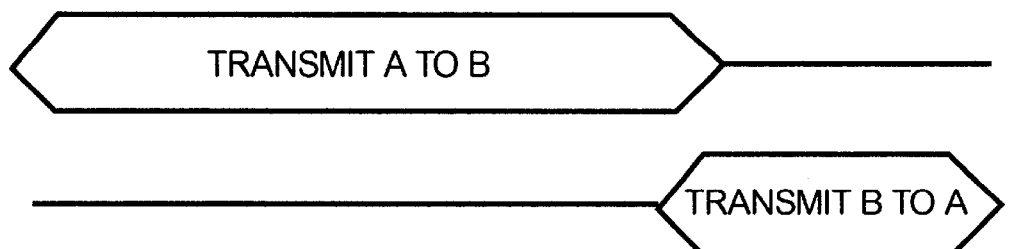
FIG. 10a is a timing diagram illustrating a time division of a single communications channel existing between points A and B.
Figure 10B:
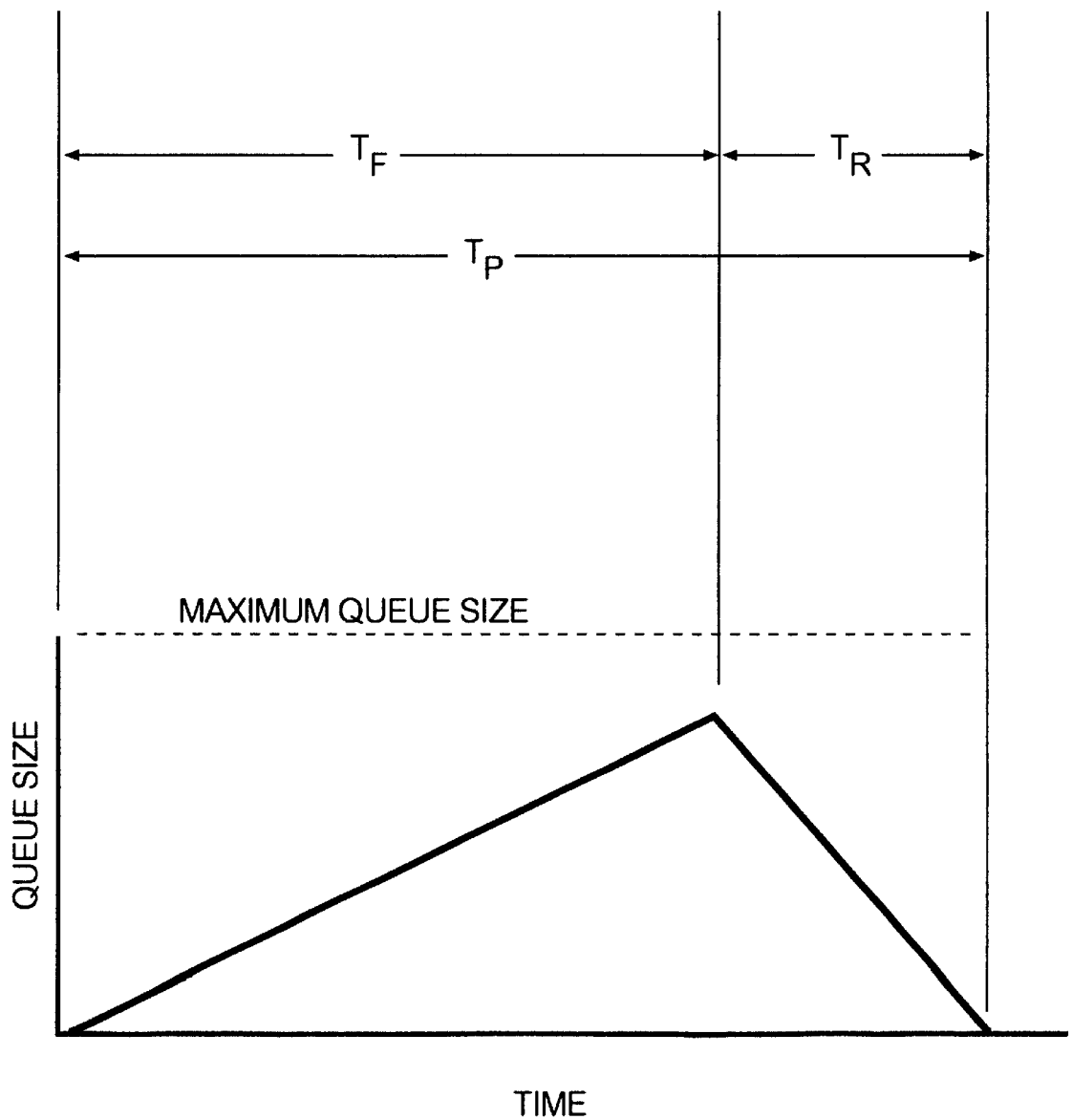
FIG. 10b is a graph illustrating the amount of data stored in a queue in relationship to two time periods, $T_F$ and $T_R$.

FIGS. 10*a–b* are diagrams illustrating an aspect of the invention that provides bi-directional communication over a single channel. This aspect of the present invention allows for a real-time data dependent device to operate in a half-duplex mode over a single channel, and to participate in bidirectional communication.

FIG. 10*a* is a timing diagram illustrating a time division of a single communications channel existing between points A and B. For purposes of discussion, equipment at point A is referred to as a master device and equipment at point B is referred to as a slave device. In operation, the slave device receives data from the master device, operates on the received data, and transmits a response to the master device. Information is transmitted over the communications channel in the forward direction (i.e., from point A to point B) during a time period $T_F$ and in the reverse direction (i.e., from point B to point A) during time period $T_R$. Thus, during a cycle time period $T_P$, the communications channel is used for bi-directional communication.

The bi-directional communication is generally achieved by implementing a queue in the slave device. During the time period $T_F$, the queue in the slave device is loaded at a rate $R_L$ that is greater than the rate that the slave device operates on or consumes the data $R_C$. During the time period $T_R$, the slave device continues to consume data in the queue while transmitting data to the master device. A key aspect of this feature is selecting the values of $T_F$ and $T_R$ so that the queue within the slave device does not overflow or under-flow. An overflow occurs when the amount of data received by the slave device exceeds the maximum queue size. An under-flow occurs when the slave device exhausts the data in the queue and hence, empties the queue.

FIG. 10*b* is a graph illustrating the amount of data stored in the queue in relationship to the time periods $T_F$ and $T_R$. During the time period $T_F$, the amount of data stored in the queue increases and during the time period $T_R$, the amount of data stored in the queue decreases. One method to implement this feature, given that the time period $T_R$ is fixed, is to ensure that the rate of loading is larger than the rate of consumption and that the time period $T_P$ will not result in overflowing or under-flowing the queue. This can be modeled by the following equation:

$$R_L T_F - R_C T_P \geq 0.\text{ (hence, the queue is not emptied)}$$

Because $T_F = T_P - T_R$, this equation can be expressed as:

$$R_L(T_P - T_R) - R_C T_P \geq 0.$$

Solving the equation for $T_P$ results in the following equation:

$$T_P \geq (R_L T_R)/(R_L - R_C).$$

Thus, as an example, if the rate of consumption $R_C$ is equal to 1 block of data per 20 mS, the rate of loading $R_L$ is equal to 1 block per 16.4 mS, and the time period $T_R$ is equal to 20 mS, then the time period $T_P$ must be on the order of 111 mS. Depending on the size of the queue and the number of consecutive $T_P$ cycles, the value of $T_P$ can fluctuate.

The reader should understand that these values are provided for illustrative purposes only and that this method is adaptable to various time requirements, queue sizes, etc. Thus, by selecting the appropriate values, the queue of the slave device can be loaded in a manner that allows the slave device to continue to process data in the queue, while the communication channel is reversed and data is transmitted to the master device.

High Quality Speech Capability

A third aspect of the present invention is concerned with providing a high quality speech capability to a remote device over a rudimentary communication channel. This aspect of the present invention allows for the remote device to utilize inexpensive radio equipment, and hence, reduce the cost of the device. One method to transmit speech data to a remote device is to modulate a carrier signal with an analog voice signal. An alternative method is to convert an analog voice signal into digital data, transmit the digital data to a remote device, and then convert the digital data into an analog voice signal at the remote device. Both of these traditional methods require significant bandwidths.

Figure 11:
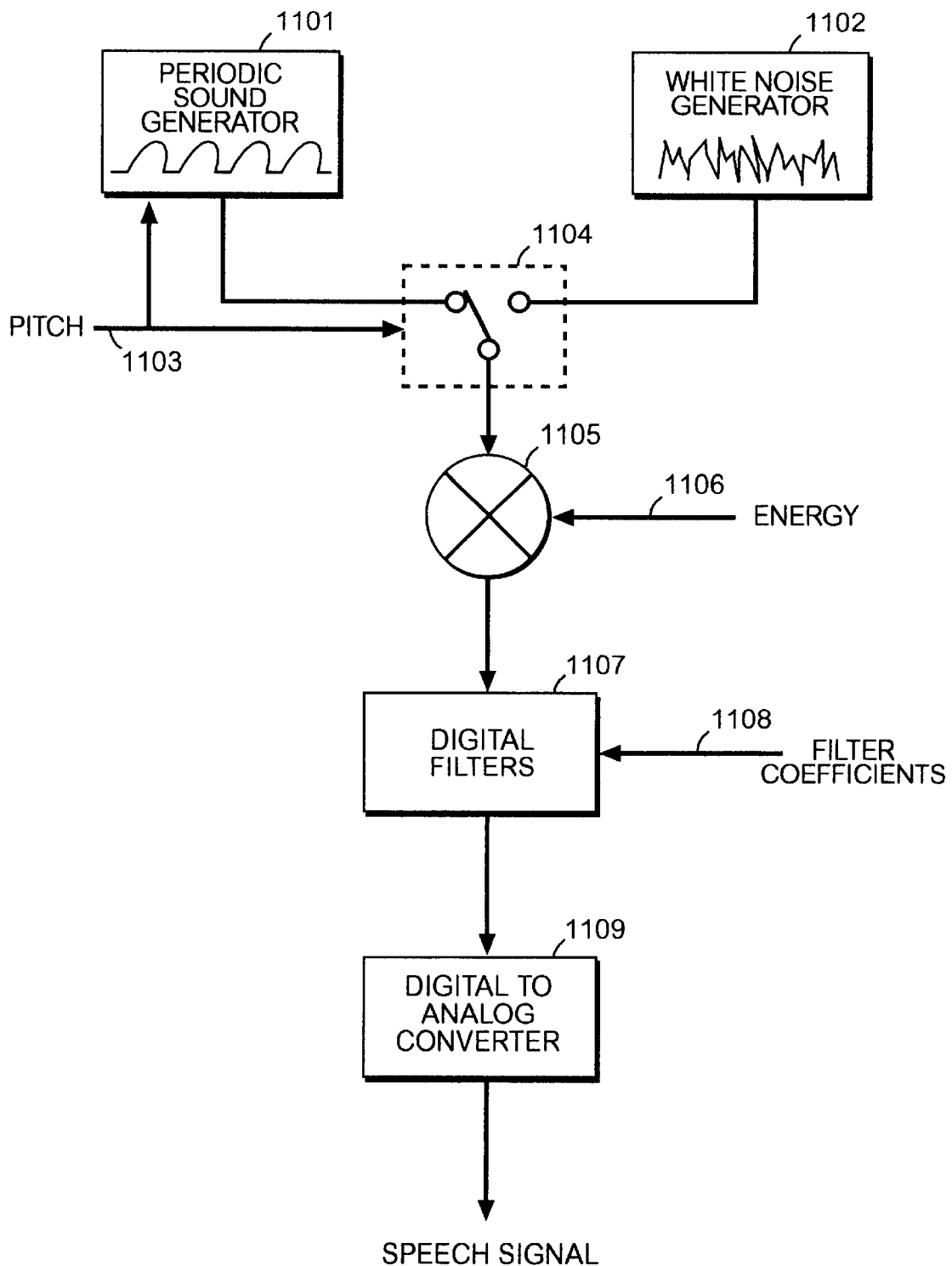
FIG. 11 is a block diagram illustrating a typical LPC vocal tract model that generates an analog speech signal based on the values of several input parameters.

One aspect of the present invention is to provide speech data to a remote device by utilizing linear predictive coding (LPC) technology. LPC technology is based on simulating predictable elements involved in the human speech process. FIG. 11 is a block diagram illustrating a typical LPC vocal tract model that generates an analog speech signal based on the values of several input parameters. The LPC vocal tract model has two sound sources: a periodic sound generator 1101 and a white noise generator 1102. The periodic sound generator 1101 generates a series of pulses similar to the sound pulses generated by the vocal cords when pronouncing the letter "A". The periodic sound generator accepts a pitch input 1103 which modifies the frequency, duration, and shape of the pulses to model various sounds (i.e., A, E, I, O, U, etc.). The white noise generator 1102 generates a signal similar to the hissing sound created by restricting air flow by the lips, tongue and teeth when pronouncing sounds like the letters "S" and "F".

Switch 1104 is used to select one of the two sound sources as an input to the energy multiplier 1105. The energy multiplier 1105 multiplies the input sound signal by an energy input signal 1106 to vary the volume of the sound signal. The multiplied sound signal is then passed through a series of digital filters that model the shape of the oral cavity. By adjusting the filter coefficients 1108, the sound signal can be converted into various speech sounds. Finally, the filtered signal is passed through a digital to analog converter (DAC) 1109 to convert the digital signal into an analog speech signal.

LPC technology takes advantage of the characteristic that speech signals change slowly over small periods of time. Thus, by dividing a period of speech into small frames of 10–25 mS, the speech can be modeled utilizing LPC technology. A set of parameters is selected for each frame. These parameters include pitch, energy and several filter coefficients. By sequentially loading these parameters into an LPC device, a high quality speech signal can be generated.

This aspect of the present invention is realized by placing an LPC chip-set into a remote device and then transmitting the necessary parameters for each frame to the remote device. Each frame of the speech signal is then represented by an amount of data that is significantly less than what is required by direct digitization of the analog speech signal. For instance, the parameters required to generate a speech frame using the TSP50C0X/1X family of speech synthesizers developed by Texas Instruments can be represented in 56 bits.

From the foregoing description, it will be appreciated that the present invention provides bandwidth efficient, bi-directional communication over a single communications channel for controlling the operation of remote devices. In addition, the present invention includes a method to provide a high quality speech capability to controllable devices based on the bandwidth efficient, bi-direction communications method. Although the present invention has been described as being embodied within a realmation system including a master device and one or more realmation performers, it will be appreciated that the present invention can be utilized in a variety of systems. This includes wireless and non-wireless communication systems for controlling a variety of remotely located devices. Indeed, the present invention is not limited to any particular application.

The present invention may be conveniently implemented in one or more program modules. No particular programming language has been indicated for carrying out the various tasks described above because it is considered that the operation, steps, and procedures described in the specification and illustrated in the accompanying drawings are sufficiently disclosed to permit one of ordinary skill in the art to practice the instant invention. Moreover, in view of the many different types of computers and program modules that can be used to practice the instant invention, it is not practical to provide a representative example of a computer program that would be applicable to these many different systems. Each user of a particular computer would be aware of the language and tools which are more useful for that user's needs and purposes to implement the instant invention.

The present invention has been described in relation to particular embodiments which are intended in all respects to be illustrative rather than restrictive. Those skilled in the art will understand that the principles of the present invention may be applied to, and embodied in, various program modules for execution on differing types of computers regardless of the application.

Alternative embodiments will become apparent to those skilled in the art to which the present invention pertains without departing from its spirit and scope. Accordingly, the scope of the present invention is described by the appended claims and supported by the foregoing description.

We claim:

1. A system for transferring a block of data elements from a first device to a second device over a communications channel, comprising:

the first device operative to:

(a) initialize a last-encoded-data-element variable to a first logical value;

(b) select a data element from the block of data elements;

(c) if the logical values of the data element and the last-encoded-data-element variable are not equal, transmit a signal representing a first data symbol to the second device over the communications channel and equate the last-encoded-data-element to the logical value of the data element;

(d) if the logical values of the data element and the last-encoded-data-element variable are equal, select a next data element from the block of data elements, if the logical values of the data element and the next data element are equal, transmit a signal representing a second data symbol to the second device over the communications channel, and if the logical values of the data element and the next data element are not equal, transmit a signal representing a third data symbol to the second device over the communications channel and equate the logical value of the last-encoded-data element to the logical value of the next data element; and (e) repeat the tasks (b)–(d) until each data element of the block of data elements have been transferred, the block of data elements comprising control data for causing the second device to respond in a manner dictated by the control data.

2. The system of claim 1, wherein prior to transmitting any data symbols to the second device over the communications channel, the first device is operative to transmit at least one synchronization symbol to the second device over the communications channel.

3. The system of claim 1, wherein the first device is operative to, if all the data elements in the block of data have been transferred, transmit at least one synchronization symbol to the second device over the communications channel.

4. The system of claim 1, wherein the first device is operative to transmit at least one synchronization symbol to the second device over the communications channel before and after transferring the data symbols representing the block of data elements.

5. The system of claim 1, wherein the first device is operative to select a next data element by, determining if at least one additional data element remains to be selected from the block of data elements and if not, transmitting a synchronization symbol to the second device over the communications channel.

6. The system of claim 1, wherein the second device is operative to:
    initialize a last-decoded-data-element variable to the first logical value;
    receive data symbols over the communication channel; and
    convert the data symbols into a block of data elements by:
        if a first data symbol is received, toggling the logical value of the last-decoded-data-element variable and equating a data element represented by the first data symbol to the logical value of the last-decoded-data-element variable;
        if a second data symbol is received, equating the logical value of a first data element represented by the second data symbol to the logical value of the last-decoded-data-element, toggling the logical value of the last-decoded-data-element, equating a second data element represented by the second data symbol to the logical value of the last-decoded-data-element; and
        if a third data symbol is received, equating the logical value of a first and second data element represented by the third data symbol to logical value of the last-decoded-data-element variable.

7. The system of claim 6, wherein the second device operates in one of two modes including a ready mode and an idle mode, and prior to the initialize a last-decoded-data-element variable step, is further operative to:
    receive a synchronization symbol over the communication channel; and
    if the synchronization symbol is received while the second device is operating in the idle mode, change the operation of the second device to the ready mode.

8. The system of claim 7, wherein if a synchronization symbol is received after the initialize a last-decoded-data-element variable step and N−1 data elements of an N sized block of data elements has been received, the second device is further operative to equate the logical value of a data element represented by the synchronization symbol to the logical value of the last-decoded-data-element variable.

9. The system of claim 1, wherein the communications channel has a physical data transfer rate of X bits/second that translates into a standard pulse width of 1/X seconds/bit, and the average effective data rate is increased to greater than X bits/second by:

defining the first data symbol to be a pulse having a width of one standard pulse-width;
defining the second data symbol to be a pulse having a width of one and a half standard pulse-widths; and
defining the third data symbol to be a pulse having a width of two standard pulse-widths.

10. The system of claim 9, wherein the synchronization symbol is defined to be a pulse having a width of two and one half standard pulse-widths.

11. The system of claim 1, wherein the communications channel has a bandwidth of X bits/second that translates into a standard pulse width of 1/X seconds/bit, and the bandwidth required to transmit the signal is bound between 50% to 100% of the X bits/second bandwidth by:
    defining the first data symbol to be a pulse having a width of one standard pulse-width;
    defining the second data symbol to be a pulse having a width of one and a half standard pulse-widths; and
    defining the third data symbol to be a pulse having a width of two standard pulse-widths.

12. A system operative for providing bi-directional communication between a first and a second device over a single communications channel, the first device and second device being capable of transmitting and receiving data at a transfer rate, the second device being capable of expending data at a consumption rate, the consumption rate being less than the transfer rate, comprising:
    the first device operative for transmitting a first block of data to the second device over the single communications channel at the transfer rate, the first block of data comprising control data for causing the second device to respond in a manner dictated by the control data;
    the second device operative for, while receiving the first block of data, storing the received data into a queue, and expending the received data from the queue at the consumption rate; and
    the second device further operative for, after receiving the entire first block of data, transmitting a second block of data to the first device over the single communications channel at the transfer rate while expending the received data from the queue at the consumption rate.

13. The system of claim 12, wherein the data transfer rate is in the range of 1.14 to 1.22 times the consumption rate.

14. The system of claim 12, wherein the data transfer rate, the consumption rate, the size of the first block, and the size of the second block of data are selected to ensure that the queue does not overflow while the first block is being received and does not under-flow while the second block is being transmitted.

15. A computer-readable medium having computer-executable instructions for causing the first device and the second device to operate in the manner recited in claim 14.

16. A system for utilizing a single communications channel for bi-directional communication between two devices, comprising:
    a first transceiver configured for transmitting control data for causing a remote device to respond in a manner dictated by the control data;
    a second transceiver, functionally connected to the first transceiver by the single communications channel;
    a data buffer, coupled to the second transceiver for storing the control data;
    a means for expending the control data from the data buffer and delivering the control data for performance by the remote device;

during a time period $T_F$, the first transceiver being operative to transmit the control data to the second transceiver over the single communications channel at a transfer rate $R_F$, and the second transceiver being operative to receive the control data at the transfer rate $R_F$, store the control data into the data buffer, and expend the control data from the data buffer at a consumption rate $R_C$, the consumption rate $R_C$ being less than the transfer rate $R_F$;

during a time period $T_R$, the second transceiver being operative to transmit response data to the first transceiver over the single communications channel at a transfer rate $R_R$, while expending the control data from the data buffer at the consumption rate $R_C$ to cause the remote device to continuously perform in response to the control data while the first and second transceivers engage in bidirectional communications.

17. The system of claim 16, wherein the values of $T_F$, $T_R$, $R_F$, $R_C$, and $R_R$, are selected to ensure that the data buffer is not overflowed during the time period $T_F$ and under-flowed during the time period $T_R$.

18. The system of claim 16, wherein the transfer rate $R_F$ is at least 1.14 times the consumption rate $R_C$.

19. The system of claim 16, wherein data is transmitted in data groups, the consumption rate $R_C$ is equal to 50 data groups per second, the time period $T_R$ is at least 40 mS, and the values of $T_F$, $R_F$, and $R_R$ are selected to ensure that the data buffer is not overflowed during the time period $T_F$ and under-flowed during the time period $T_R$.

20. A system for remotely controlling and receiving return data from a sound synthesizing device over a wireless communications channel, comprising:

a master device including:
a master processing unit;
a memory storage device and a transmitter, both coupled to the master processing unit;
a master program module, stored in the memory storage device of the master device, for providing instructions to the master processing unit;

a sound synthesizing device including:
a slave processing unit,
a memory storage device, a speech synthesizer based on linear predictive coding techniques, and a receiver, all coupled to the slave processing unit;
a speaker coupled to the speech synthesizer;
a slave program module, stored in the memory storage device of the sound synthesizing device, for providing instructions to the slave processing unit;

the master processing unit, responsive to the instructions of the master program module, being operative to:
select a block of linear predictive coding coefficients, the set of linear predictive coding coefficients comprising data for providing sound synthesis for a fixed period of time; and
cause the transmitter to transmit the block of linear predictive coding coefficients to the sound synthesizing device over the communications channel;

the slave processing unit, responsive to the instructions of the slave program module, being operative to:
receive from the receiver, the block of linear predictive coding coefficients;
store the block of linear predictive coding coefficients in a queue; and
provide the linear predictive coding coefficients from the queue to the speech synthesizer during the fixed period of time;

the speech synthesizer, in response to receiving the linear predictive coding coefficients, being operative to:
convert the coefficients into audio signals; and
provide the audio signals to the speaker; and the slave processing unit further operative to transmit the return data to the master device during the fixed period of time and while the speech synthesizer provides the audio signals to the speaker.

21. A method for a master device to control and receive return data from a remotely located speech synthesizing device, the speech synthesizing device including a receiver, a linear predictive coding (LPC) speech synthesizer, and a speaker, the method comprising the steps of:

(a) at the master device, selecting a block of LPC coefficients for causing the speech synthesizing device to generate an audio signal for a predefined period of time, and transmitting the of LPC coefficients to the speech synthesizing device;

(b) at the speech synthesizing device, receiving the block of LPC coefficients, storing the LPC coefficients in a queue, and during the predetermined period of time, reading the LPC coefficients out of the queue, converting the LPC coefficients into the audio signal, providing the audio signal to the speaker, and transmitting the return data to the master device; and (c) periodically repeating steps (a) and (b) to cause the speech synthesizing device to continuously convert the LPC coefficients into the audio signal whicle the master device and the speech synthesizing device engage in bidirectional communications.

22. The method of claim 21, wherein a block of LPC coefficients represents X seconds of speech, and N seconds of speech is provided to the speech synthesizing device by repeating each of the steps until N/X blocks of LPC coefficients have been completed, where X and N are positive numbers.

23. A communications system for providing bandwidth efficient, bidirectional communications over a single communications channel for controlling the operation of remote devices, comprising:

a computer system including a processing unit, a memory storage device coupled to the processing unit of the computer system, a master program module located in the memory storage device for providing instructions to the processing unit of the computer system, a speaker, and a display device, a link master controller, being functionally connected to the computer system and including a processing unit, and a transceiver system;

a remote device including a transceiver system, a speech synthesizer, a speaker, at least one motion servo motors, a data buffer, and at least one sensor device;

the computer system being operative to continuously provide an audio/video presentation on the speaker and display device;

during a first time period,
the computer system being operative to:
retrieve control data from the memory storage device, the control data having a relationship with the current state of the audio/video presentation, and
provide control data to the link master controller;
the link master controller being operative to:
receive the control data from the control system,
encode the control data to reduce bandwidth requirements, and
transmit the encoded control data to the remote device; and the remote device being operative to:
  receive the encoded control data,
  decode the encoded control data,
  place the control data into the data buffer, and
  operate on the control data in the data buffer by actuating at least one motion servo motor and providing data to the speech synthesizer; and
during a second time period,
the remote device being operative to:
  operate on the control data in the data buffer by actuating at least one motion servo motors and providing data to the speech synthesizer,
  formulate a response message based on the status of at least one sensor device,
  encode the response message, and
  transmit the encoded response message to the link master controller;
the link master controller being operative to:
  receive the encoded response message from the remote device,
  decode the encoded response message, and
  provide the response message to the computer system; and
the computer system being operative to:
  receive the response data from the link master controller, and
  alter the audio/video presentation in accordance with the response data.

24. The communications system of claim 23, wherein the control data contains linear predictive coding coefficients for providing a fixed period of speech.

25. The communications system of claim 23, wherein the control data contains control information for a motion servo motor.

26. The communications system of claim 23, wherein the link master controller and the remote device are operative to encode the control data by:
  initializing a last-encoded-data-element variable to a first logical value;
  selecting a data element from the control data;
  if the logical values of the data element and the last-encoded-data-element variable are not equal, encode the data element as a first data symbol and equate the last-encoded-data-element to the logical value of the data element;
  if the logical values of the data element and the last-encoded-data-element variable are equal, select a next data element from the control data,
    if the logical values of the data element and the next data element are equal, encode the data element and the next data element as a second data symbol, and
    if the logical values of the data element and the next data element are not equal, encode the data element and the next data element as a third data symbol and equate the logical value of the last-encoded-data element to the logical value of the next data element; and
  repeat the steps after the initialize step until each data element of the control data has been transferred.

27. The communications system of claim 23, wherein the link master controller and the remote device are operative to decode by:
  initializing a last-decoded-data-element variable to the first logical value;
  selecting a data symbol from the encoded data; and
  converting the selected data symbol into one or more data elements by:
    if the selected data symbol is a first data symbol, toggling the logical value of the last-decoded-data-element variable and equating a data element represented by the selected data symbol to the logical value of the last-decoded-data-element variable;
    if the selected data symbol is a second data symbol, equating the logical value of a first data element represented by the selected data symbol to the logical value of the last-decoded-data-element, toggling the logical value of the last-decoded-data-element, equating a second data element represented by the selected data symbol to the logical value of the last-decoded-data-element; and
    if the selected data symbol is a third data symbol, equating the logical value of a first and second data element represented by the selected data symbol to logical value of the last-decoded-data-element variable.

28. The communications system of claim 23, wherein the first time period and the second time period are selected to ensure that the data buffer in the remote device will contain enough control data to allow the remote device to operate on the control data in the data buffer during the entire second time period.

* * * * *